United States Patent
Feick

(10) Patent No.: US 10,594,966 B2
(45) Date of Patent: Mar. 17, 2020

(54) OPTICAL SENSOR DEVICE AND METHOD FOR MANUFACTURING THE OPTICAL SENSOR DEVICE

(71) Applicant: Infineon Technologies AG, Neubiberg (DE)

(72) Inventor: Henning Feick, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 350 days.

(21) Appl. No.: 15/472,367

(22) Filed: Mar. 29, 2017

(65) Prior Publication Data
US 2017/0332024 A1 Nov. 16, 2017

(30) Foreign Application Priority Data
May 13, 2016 (DE) .................. 10 2016 208 343

(51) Int. Cl.
*H04N 5/363* (2011.01)
*H01L 27/146* (2006.01)
*H04N 5/378* (2011.01)

(52) U.S. Cl.
CPC ....... *H04N 5/363* (2013.01); *H01L 27/14614* (2013.01); *H01L 27/14616* (2013.01); *H04N 5/378* (2013.01)

(58) Field of Classification Search
CPC .. H04N 5/3745; H04N 5/37457; H04N 5/378; H04N 5/63; H04N 5/37455; H04N 5/3765; H01L 27/14605; H01L 27/14614; H01L 27/1463; H01L 27/14616; G06T 5/20
See application file for complete search history.

(56) References Cited

U.S. PATENT DOCUMENTS

| 8,792,087 | B2 | 7/2014 | Spickermann et al. |
| 9,000,349 | B1 | 4/2015 | Lehmann et al. |
| 2014/0092287 | A1* | 4/2014 | Jin ................. H04N 5/3745 348/301 |
| 2015/0122973 | A1 | 5/2015 | Kim et al. |

FOREIGN PATENT DOCUMENTS

| CN | 103716557 A | 4/2014 |
| CN | 104126131 A | 10/2014 |
| DE | 102013110695 | 4/2014 |

* cited by examiner

*Primary Examiner* — Luke D Ratcliffe
(74) *Attorney, Agent, or Firm* — Harrity & Harrity, LLP

(57) ABSTRACT

An optical sensor device comprising a conversion region to convert an electromagnetic signal into photo-generated charge carriers is shown. The optical sensor device comprises a read-out node configured to read-out the photo-generated charge carriers and a control electrode which is separated by an isolating material from the conversion region. Furthermore, the optical sensor device comprises a doping region in the semiconductor substrate between the control electrode and the conversion region, wherein the doping region comprises a higher doping concentration compared to a minimum doping concentration of the conversion region, wherein the doping concentration is at least 1000 times higher than the minimum doping concentration of the conversion region and wherein the doping region extends into the semiconductor substrate. Moreover, a projection of the control electrode towards the conversion region overlaps the doping region or is located in the doping region. Embodiments show the optical sensor device as a time-of-flight sensor.

22 Claims, 14 Drawing Sheets

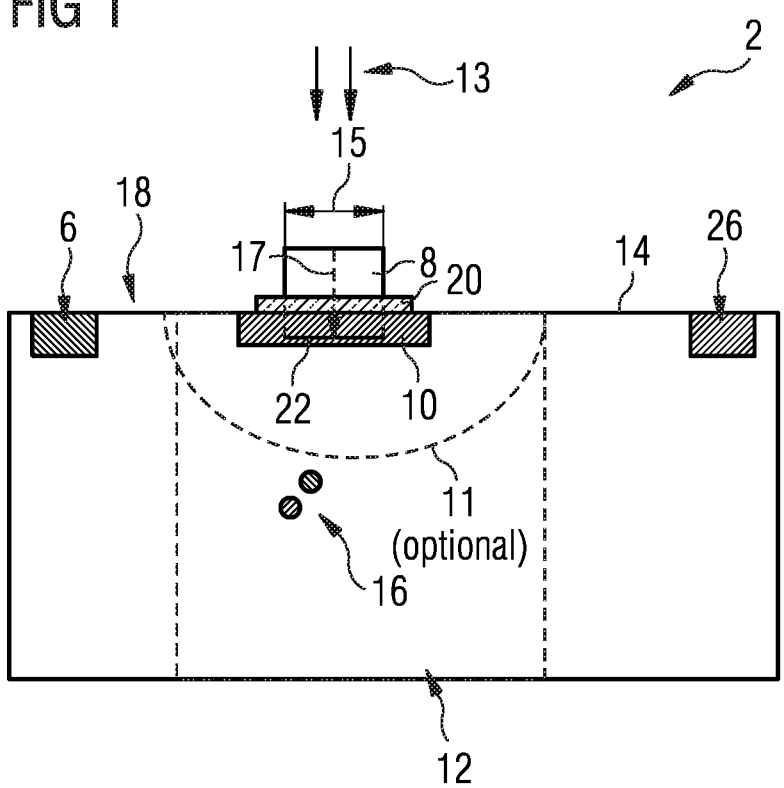

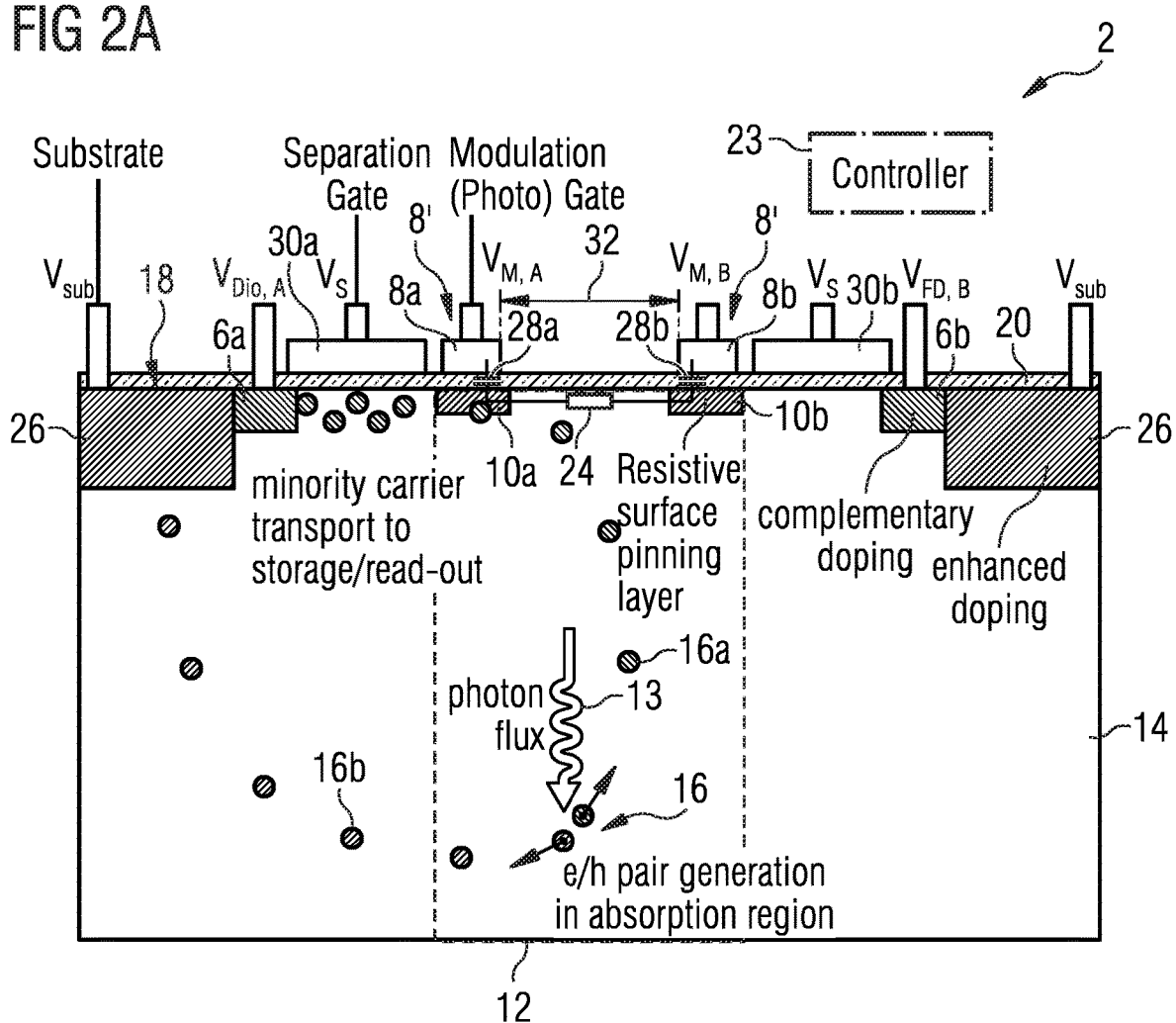
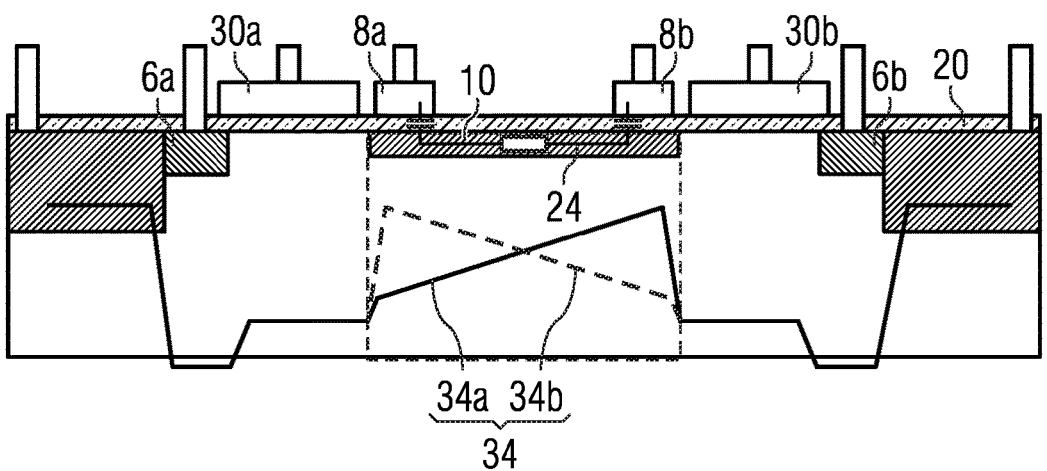

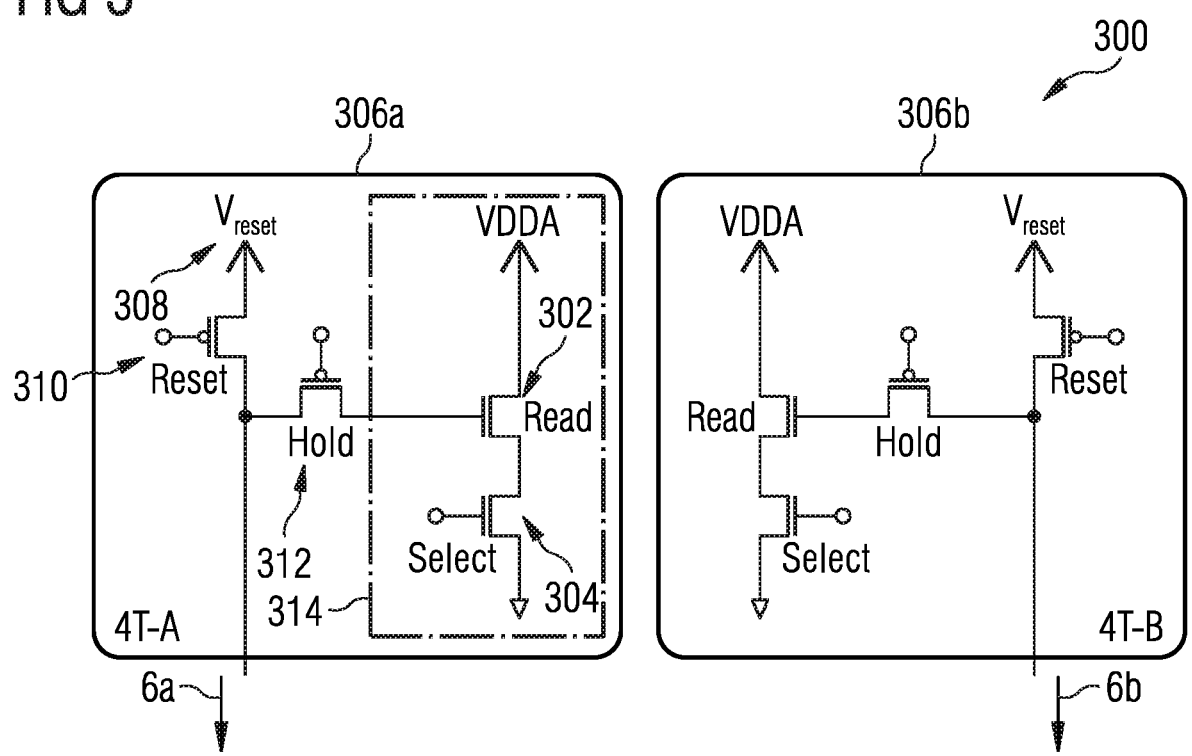

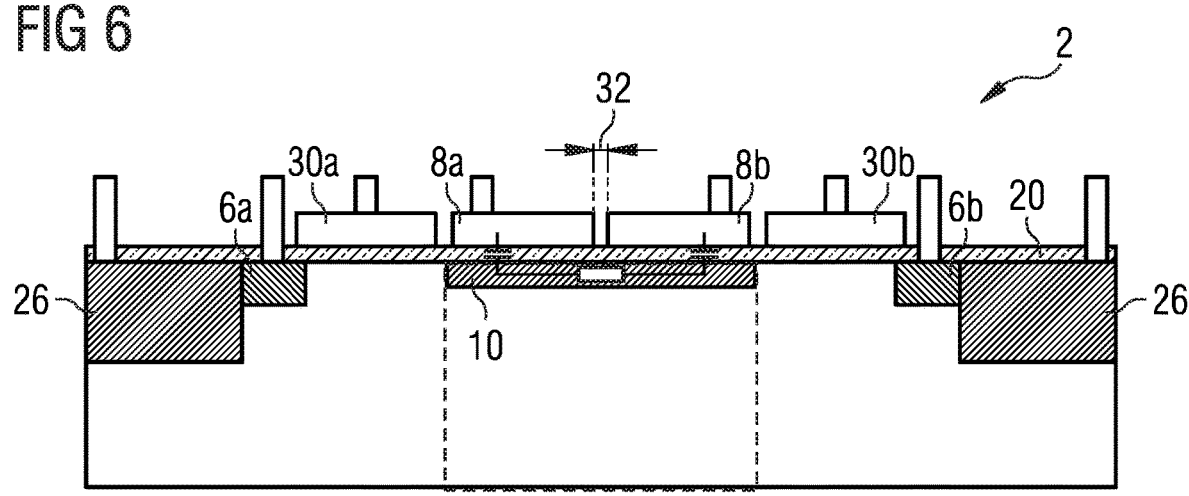
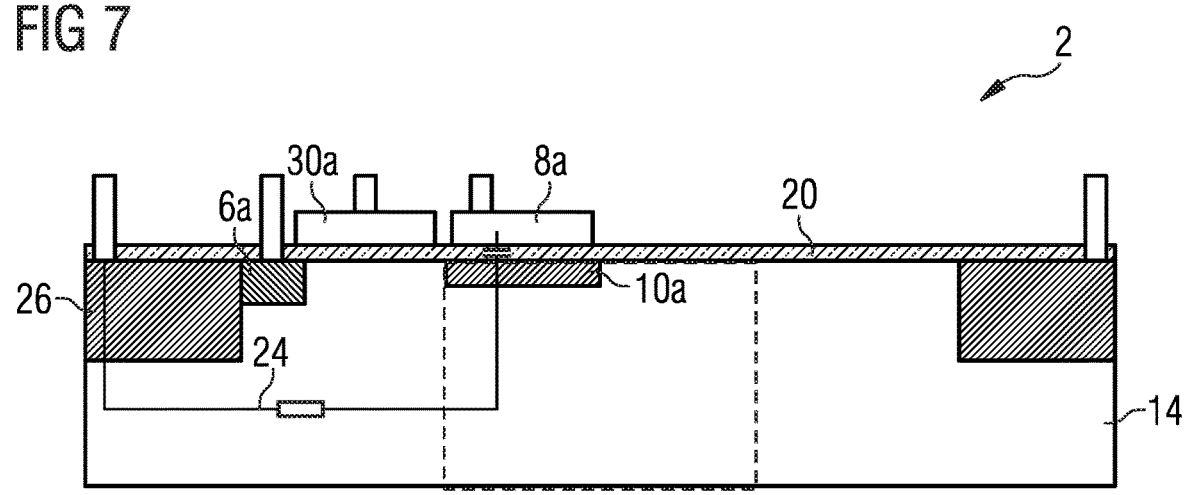

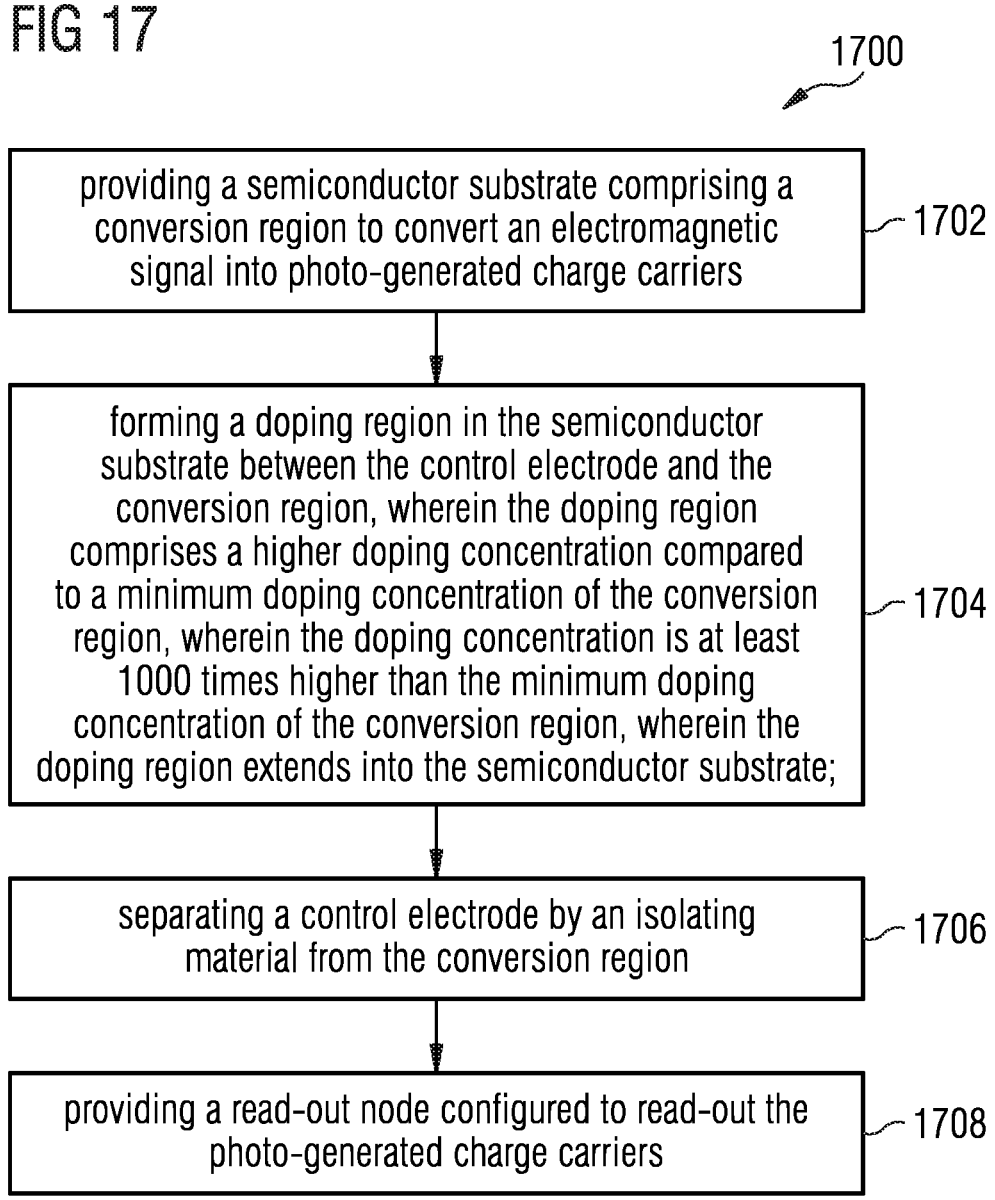

OPTICAL SENSOR DEVICE AND METHOD FOR MANUFACTURING THE OPTICAL SENSOR DEVICE

RELATED APPLICATION

This application claims priority under 35 U.S.C. § 119 to German Patent Application No. 102016208343.0, filed on May 13, 2016, the content of which is incorporated by reference herein in its entirety.

TECHNICAL FIELD

This disclosure relates in general to the field of integrated circuits, more specifically to the field of optical sensors employing photogate structures for redirection of photo-generated charge carriers. Further embodiments show a photo-mixing device for time-of-flight depth ranging applications or a time-of-flight sensor.

BACKGROUND

Optical sensors and specifically photo-mixing devices suffer from a great impact of dark current from e/h pair-generation, for example, at an oxide interface inherent to the photogate structure. For example shot noise limits the signal-to-noise ratio (SNR). Moreover, sensor saturation occurs when integration nodes are used for read-out. Since both effects increase at higher temperatures, the upper operating temperature is limited by exponentially increasing dark current. Separating the photo-generated signal from the dark current may require complex signal analysis.

A further issue is the redirection of the photo-generated charge carriers. To redirect the photo-generated charge carriers, the photogates are located adjacent to a depleted silicon region. Therefore, expensive processes and tools are used to control the doping concentration in the bulk (EPI) such as a semiconductor substrate. Furthermore, the need of a depleted silicon region to shift the photo-generated charge carrier limits the depth of the absorption region in which good carrier redirection, in terms of a demodulation contrast, can be achieved with high demodulation frequency. Moreover, photogates located in the optical path may result in an optical absorption or an optical reflection of the photogate, especially at short wavelengths.

Thus, the current design of optical sensors employing photogate structures, such as photo-mixing devices, suffer from essential limitations of the quality of the sensor signal caused by the design of the sensors.

SUMMARY

Therefore, there is a need for improved optical sensors with an enhanced capability to convert the optical signal in an electrical signal.

An optical sensor device comprising semiconductor substrate with a conversion region to convert an electromagnetic signal into photo-generated charge carriers is shown. The optical sensor device further comprises a read-out node configured to read-out the photo-generated charge carriers and a control electrode which is separated by an isolating material from the semiconductor substrate. Furthermore, the optical sensor device comprises a doping region in the semiconductor substrate between the control electrode and the conversion region, wherein the doping region comprises a higher doping concentration, of e.g. but not necessarily the same type, compared to a minimum doping concentration of the conversion region, wherein the doping concentration is at least 1000 times higher than the minimum doping concentration of the conversion region and wherein the doping region extends into the semiconductor substrate. However, embodiments also show the doping region with a doping concentration of a different type than the conversion region. Moreover, a projection of the control electrode towards the conversion region overlaps the doping region or is located in the doping region. Embodiments show the optical sensor device as a time-of-flight sensor.

Such a doping region, comprising a doping concentration being greater than a minimum doping concentration of the semiconductor substrate, allows for providing an electric modulation field in the semiconductor substrate. The electric modulation field (also referred to as potential distribution) may be used to demodulate an inbound electromagnetic signal such as light from infrared to ultraviolet wavelengths. The electric modulation field may be caused by the control electrode, capacitively inducing or providing a current to the semiconductor substrate. The current may be formed using free charge carriers of the doping region. Since the doping region comprises a large number of charge carriers compared to the charge carriers present in the semiconductor substrate, a depletion of the semiconductor substrate adjacent to the control electrode is prevented. Therefore, an alternating current in the doping region provides a drift field in the semiconductor substrate such that a shift of the minority charge carriers is performed using a drift of the same. This outperforms a use of a space-charge region in the semiconductor substrate to shift charge carriers, since outside the space-charge region, which may only reach a limited depth, charge carriers are shifted by comparatively slow diffusion. Therefore, using the described doping region, a faster measurement of the optical sensor device is achieved. Moreover, the space-charge region may cause a depleted (surface) area of the semiconductor substrate which is a major reason for charge carrier generation and therefore a major aspect for occurring noise in the read-out signal. Since embodiments do not show a depletion region adjacent to the control electrode, it is not likely for the charge carriers to be generated. Therefore, an improved signal-to-noise ratio is obtained.

Embodiments show an optical time of flight sensor device comprising a semiconductor substrate, a read-out node, a control electrode, and a vertical extending doping region. The semiconductor substrate further comprises a conversion region to convert an electromagnetic signal into photo generated charge carriers. The read-out node is configured to read-out photo-generated charge carriers, the read-out node comprising a first doping type. The control electrode is separated by an isolating material from the conversion region. Moreover, the vertical extending doping region is formed in the semiconductor substrate wherein the vertical extending doping region comprises the first doping type, wherein at least a part of the vertical extending doping region provides a conversion of at least a portion of the electromagnetic signal into the photo-generated charge carriers.

Further embodiments show an optical time of flight sensor device comprising a semiconductor substrate, a read-out node, a control electrode, and a separation gate. The semiconductor substrate comprises a conversion region to convert an electromagnetic signal into photo-generated charge carriers. The read-out node is configured to read-out the photo-generated charge carriers. The control electrode is separated by an isolating material from the semiconductor substrate. The separation gate is separated by an isolating material from the semiconductor substrate. Moreover, the control electrode and the isolating material are formed in a trench of the semiconductor substrate, wherein an extension of the trench into the semiconductor substrate perpendicular to a main surface region is greater than a distance between the read-out node and the trench. Additionally or alternatively, the extension of the trench into the semiconductor substrate perpendicular to a main surface region may be greater than a lateral extension of the separation gate.

BRIEF DESCRIPTION OF THE DRAWINGS

Embodiments of the disclosure will be discussed subsequently referring to the enclosed drawings, wherein:

FIG. 1 shows a schematic cross-sectional view of an optical sensor device;

FIG. 2A shows a schematic cross-sectional view of the optical sensor device according to one of a number of embodiments;

FIG. 2B shows a schematic illustration of a potential distribution of one of a number of embodiments of the optical sensor device;

FIG. 3 shows an exemplary read-out circuit to read-out the photo-generated charge carriers from the read-out node;

FIG. 6 shows a schematic cross-sectional view of the optical sensor device according to one of a number of embodiments where the two control electrodes have a small gap in-between;

FIG. 7 shows a schematic cross-sectional view of the optical sensor device according to one of a number of embodiments with a single control electrode;

FIG. 17 shows a schematic block diagram of a method for forming an optical sensor device.

DETAILED DESCRIPTION

Figure 4:
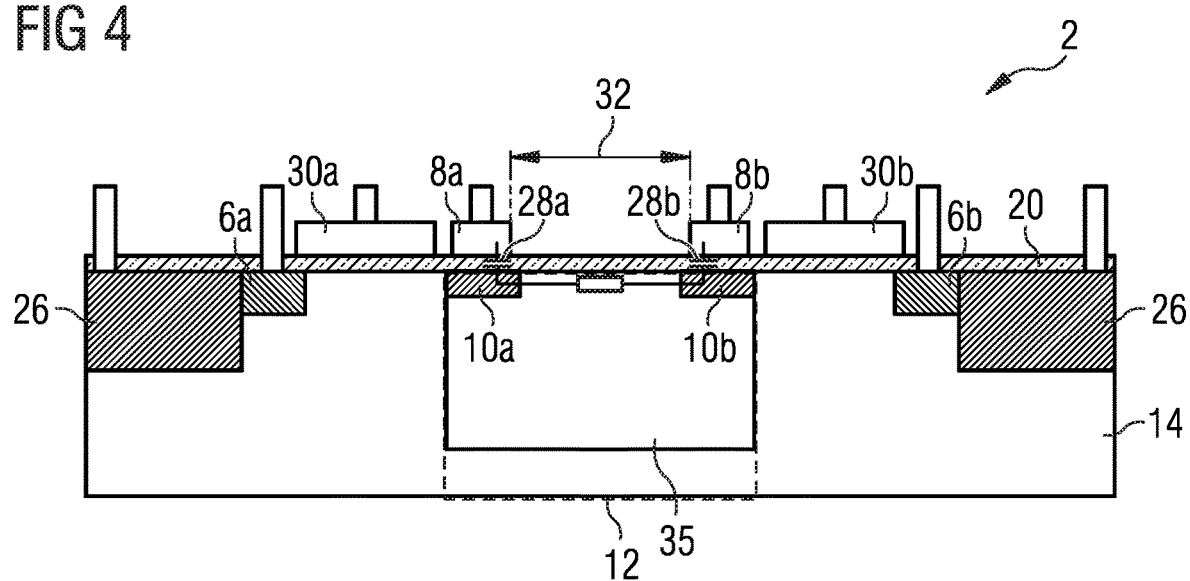
FIG. 4 shows a schematic cross-sectional view of the optical sensor device according to one of a number of embodiments showing a variation of the conversion region.

In the following, embodiments of the disclosure will be described in further detail. Elements shown in the respective figures having the same or a similar functionality will have associated therewith the same reference signs.

FIG. 1 shows a schematic cross-sectional view of an optical sensor device 2 comprising a semiconductor substrate 14, a read-out node 6, a control electrode 8 and a doping region 10. The optical sensor device 2 may in some embodiments be a portion of one pixel of an array of pixels. The semiconductor substrate 14 comprises a conversion region 12 to convert an electromagnetic signal 13 into photo-generated charge carriers 16. At a main surface region 18 of the semiconductor substrate 14 the read-out node and the control electrode are located. The read-out node is configured to read-out the photo-generated charge carriers 16, wherein the control electrode 8 is separated by an isolating material 20 from the conversion region 12 and/or the semiconductor substrate 14. Moreover, the doping region 10 is formed in the semiconductor substrate 14 between the control electrode 8 and the conversion region 12. The doping region 10 comprises a higher doping concentration compared to a minimum doping concentration of the conversion region 12. A substrate contact 26, for example an enhanced doping region, may be provided in the semiconductor substrate 14. The doping region 10 and the substrate contact 26 may have the same doping type, wherein the read-out node 6 and the doping region 10 (or the read-out node 6 and the substrate contact 26) may have a different (complementary) doping types.

A (absolute value of the) doping concentration may be at least 1000 times higher than a minimum doping concentration of the conversion region 12. Moreover, the doping of the doping region 10 may be of the same type or of a different type when compared to the type of the doping of the conversion region and/or of the same type when compared to the type of the doping of the substrate contact. Furthermore, the doping region 10 may be connected to the substrate contact, to a ground potential and/or to the lowest electrical potential of the optical sensor device, however, the connection having a high resistivity. Moreover, the doping region 10 extends into the semiconductor substrate 14. A projection 22 of the control electrode 8 towards the conversion region 12 (in FIG. 1 the projection towards the conversion region is a projection in the vertical direction) overlaps the doping region 10 or is located in the doping region 10. According to embodiments, the optical sensor device is a time-of-flight sensor.

Alternatively, the following definition of the doping region may apply, wherein the further aspects may be applied as described above. The doping region 10 in the semiconductor substrate 14 may be formed between the control electrode 8 and the conversion region 12, wherein the doping region 10 comprises a higher doping concentration compared to a minimum doping concentration of the semiconductor substrate 14 determined in a region 11 extending from the doping region 10, 10a, 10b into the semiconductor substrate by a distance of a maximum extension 15 of the control electrode 8, 8a, 8b. The maximum extension may extend perpendicular to a direction of projection 17 of the control electrode towards the conversion region, wherein the doping concentration is by at least 1000 times higher than the minimum doping concentration. As described above, the maximum extension may extend perpendicular to a direction of projection 17 of the control electrode towards the conversion region.

The maximum extension of the control electrode may refer to a maximum extension in the section plane of the described figures. Therefore, if the control electrode is located on the semiconductor substrate, the maximum extension may refer to a width or a lateral or a horizontal extension of the control electrode wherein, referring to embodiments where the electrode is formed in a trench (cf. e.g. FIG. 13B), the maximum extension may refer to a height or a vertical extension. In embodiments, when referring to a three-dimensional control electrode instead of a section plane, the maximum extension may refer to a maximum diagonal, maximum radius, or a maximum length of an axis of the control electrode.

In other words, the minimum doping concentration of the semiconductor substrate may be measured in an area of a distance around the control electrode which is equal to the distance from the control electrode 8 to the substrate contact 26, wherein the distance may be measured from the center of gravity of the control electrode to the substrate contact or from a distance of the facing borders of the control electrode and the semiconductor substrate. Having, in further embodiments, the control electrode 8a and the further control electrode 8b, the minimum doping concentration of the semiconductor substrate may be measured in an area of a distance around the control electrode which is equal to the distance from the control electrode 8a to the further substrate contact 8b. In absolute values, the distance may be between 500 nanometers and 50 micrometers, between 1 micrometer and 30 micrometers, or between 3 micrometers and 10 micrometers in the drawing layer.

Furthermore, the region 11 may extend from the doping region 10. Extension in this case may refer to an extension in a half cycle (or half sphere) around the center (of gravity) in a distance of the maximum extension of the control electrode. Therefore, the radius of the half cycle may be equal to the maximum extension of the control electrode. In an alternative embodiment, extension in this case may refer to an extension in a half elliptic or half ellipsoid around an outline of the maximum extension of the control electrode.

In general, the minimum doping concentration may refer to a minimum mean or average doping concentration of a (e.g. cubic or 3-dimensional) section of the respective material of e.g. 1 µm³, 10 µm³, 30 µm³, 50 µm³, or 75 µm³. As an example, the minimum doping concentration of the conversion region may be determined as a minimum mean value in an area or section of the conversion region or more general in an area or section of the semiconductor substrate of 1, 5 or 10 µm³; e.g. several (1 to 100) doping atoms per 1 µm³. Moreover, the minimum doping concentration may refer to a minimum number of doping atoms (independent from their charge, therefore positive and negative) per cubic-centimeter, such as e.g. the conversion region or the semiconductor substrate or any other doped region. In other words, the minimum doping concentration or the doping concentration in general refers to an absolute value or a count of doping atoms, where positive and negative doping atoms contribute in the same way. In absolute values, the semiconductor substrate may be p-doped at a minimum doping concentration preferably equal or smaller than $10^{14}$ atoms/cm³ such as between $10^{12}$ and $10^{14}$ atoms/cm³ or between $2*10^{12}$ and $5*10^{13}$ atoms/cm³ or between $4*10^{12}$ and $2.5*10^{13}$ atoms/cm³.

According to further embodiments, the doping region may extend into the semiconductor substrate in the direction from the control electrode to the conversion region by a maximum of 10% of an expansion of the semiconductor substrate in the same direction. According to a further specification, the extension of the doping region into the semiconductor substrate may be less or equal to a (lateral) diameter or edge length of the control electrode measured parallel to an interface of the control electrode and the isolating material or perpendicular to a direction of propagation of the electromagnetic signal. In absolute values, the extension of the doping region (in the drawing layer) into the semiconductor substrate may be between 50 nm and 1000 nm, preferably between 100 nm and 600 nm or more preferable between 200 nm and 400 nm. Perpendicular to the drawing layer, the extension may be 5 times, 20 times, 50 times, or 200 times greater than the extension in the drawing layer. A typical penetration depth of the electromagnetic signal may be 25 µm, wherein a typical size of the semiconductor substrate in the direction of propagation of the electromagnetic signal may be e.g. 250 µm. The concept may be applied to CCD (charged coupled device) and/or CMOS (complementary metal oxide semiconductor) time-of-flight sensors using redirection of photo-generated charge carriers or applied to any other suitable design different from CCD.

FIG. 2 shows an embodiment of the optical sensor device 2. In some embodiments, the optical sensor device 2 comprises, besides the control electrode 8a and the read-out node 6a, a further control electrode 8b which is separated by an isolating material 20 from the conversion region. The isolating material 20 may separate the control electrode and the further control electrode from the conversion region. Therefore, it may be used a (continuous) layer of the isolating material or, alternatively, different, discontinuous layers. The isolating material may be an interlayer dielectric (ILD) such as an oxide interface.

Furthermore, a further doping region 10b may be provided in the semiconductor substrate between the further control electrode 8b and the conversion region 12, wherein the further doping region 10b comprises a higher doping concentration compared to a minimum doping concentration of the conversion region 12, wherein the doping concentration is at least 1000 times higher than the minimum doping concentration of the conversion region 12. Moreover, the further doping region 10b may extend into the semiconductor substrate 14. In other words, the first and/or the second doping region (or resistive surface pinning layer) may be formed by implantation of doping atoms (at the main surface area 18) in the semiconductor substrate 14. The semiconductor substrate may comprise silicon or germanium or any other semiconductor material. The control electrodes (or modulation gates) may comprise p-type polysilicon e.g. with the same doping type as a resistive pinning layer (region 10, 19, c.f. 10b).

The further doping region may be defined as following, which is an alternative definition of the previous definition. The further doping region 10b in the semiconductor substrate 14 may be located between the further control electrode 8b and the conversion region 12. The further doping region 10b may comprise a higher doping concentration compared to a minimum doping concentration of the semiconductor substrate 14 in a region 11 extending from the further doping region 10b into the semiconductor substrate by a distance of a maximum extension of the further control electrode 8b, wherein the maximum extension extends perpendicular to a direction 17 of projection 22 of the further control electrode towards the conversion region, wherein the doping concentration is by at least 1000 times higher than the minimum doping concentration, wherein the further doping region 10b extends into the semiconductor substrate 14. Furthermore, the same description as to the doping region may be applied.

The conversion region may be preferably defined as the region where electron-hole-pairs may be generated by the electromagnetic signal due to e.g. the inner photoelectric effect such as interband absorption in a semiconductor. However, the conversion region may be also referred to the area of the semiconductor substrate, where the electromagnetic signal reaches the semiconductor substrate.

According to embodiments, the control electrode and the further control electrode may be spatially separated, wherein a distance between the control electrode and the further control electrode is between 500 nanometers and 50 micrometers, between 1 micrometer and 30 micrometers, or between 3 micrometers and 10 micrometers. In other words, the gap 32 between the control electrodes may be greater than a size of the control electrode in a direction of minimum extent of the control electrode. This may be an extension parallel to the extent of the surface 8' of the control electrode or parallel to a greatest interface between the control electrode and the isolating layer 20.

According to further embodiments, the optical sensor device may comprise a controller 23 configured to control an alternating potential applied to the control electrode 8a such that an electric potential distribution is generated in the conversion region 12 to perform a phase-sensitive (or alternatively a runtime-sensitive) demodulation of the photo-generated charge carriers 16 in the conversion region. The modulation of the inbound electromagnetic signal may be performed by amplitude modulation, in one embodiment by applying a rectangular shaped filter or window such that the electromagnetic signal comprises e.g. a series of rectangular pulses. Accordingly, the demodulation may be performed by applying the same series of rectangular pulses to the modulation gates. Therefore, by shifting the rectangular pulses, the electromagnetic signal having a phase shift of the same amount may be demodulated. An exemplary electric potential distribution is shown in FIG. 2B.

However, the controller 23 may further provide the control electrode 8a and the further control electrode 8b with anti-cyclical alternating electric potentials such that an alternating current 24 is provided into the semiconductor substrate 14 between the doping region 10a and the further doping region 10b. Moreover, the alternating current 24 generates the electric potential distribution in the conversion region 12. In the respective figures, the alternating current 24 is represented or plotted by a resistive conductor path.

In other words, an alternating current or voltage may be applied to the control electrodes 8a, 8b such that an alternating electric current is induced between the doping region 10a and the further doping region 10b. Therefore, the isolating material may form a capacitor between the control electrode and the doping region such that the isolating material is not conductive or insulating direct current (DC) and has an increased admittance or susceptance for an increasing frequency of an alternating current (AC). The alternating current 24, however, provides an electric potential distribution in the conversion region. This electric potential distribution is adjusted or set in accordance with a modulation (frequency) of the electromagnetic signal 13 which may also be referred to as photon flux. Therefore, intensity-modulated light may be transmitted from a light source such as a laser to a distant object, where the emitted electromagnetic signal is reflected and provided to the optical sensor device. The alternating current or, more precisely, the electric potential distribution may therefore provide charge carriers being generated by a first phase of the electromagnetic signal to the read-out node 6a. Furthermore, photo-generated charge carriers generated by the electromagnetic signal, having a second phase with a phase shift of 180° compared to the first phase may be provided to the second read-out node 6b during the same measurement (or the same integration period).

The electromagnetic signal may generate an electron-hole (e/h) pair in the conversion region (also referred to as absorption region), wherein, for example, minority carriers 16a such as electrons are shifted to the read-out nodes, wherein the other charge carrier, for example a majority carrier 16b such as a hole, may be discharged at a (electric) substrate contact 26. This avoids a saturation of the semiconductor substrate by majority carrier. However, if electrons form the minority carrier, the semiconductor substrate may be p-doped at a minimum doping concentration preferably equal or smaller than $10^{14}$ atoms/cm$^3$ such as between $10^{12}$ and $10^{14}$ atoms/cm$^3$ or between $2*10^{12}$ and $5*10^{13}$ atoms/cm$^3$ or between $4*10^{12}$ and $2.5*10^{13}$ atoms/cm$^3$ wherein the doping regions 10a and 10b may comprise an enhanced or greater p-doping of a concentration greater than $10^{14}$ atoms/cm$^3$ such as between $10^{14}$ atoms/cm$^3$ and $10^{18}$ atoms/cm$^3$, preferably between $10^{15}$ atoms/cm$^3$ and $10^{17}$ atoms/cm$^3$ or more preferably between $5*10^{15}$ atoms/cm$^3$ and $5*10^{16}$ atoms/cm$^3$. Accordingly, the read-out nodes comprise a complimentary n-doping of a concentration greater than $10^{14}$ atoms/cm$^3$ such as between $10^{14}$ atoms/cm$^3$ and $10^{22}$ atoms/cm$^3$, preferably between $10^{16}$ atoms/cm$^3$ and $10^{21}$ atoms/cm$^3$ or more preferably between $10^{18}$ atoms/cm$^3$ and $5*10^{20}$ atoms/cm$^3$. The substrate contact 26 may comprise an enhanced doping greater than $10^{14}$ atoms/cm$^3$ such as between $10^{14}$ and $10^{20}$, preferably between $10^{16}$ and $10^{19}$ or more preferably between $10^{17}$ and $5*10^{18}$. However, the n- and p-doping orientation may be swapped or interchanged, such that holes are minority carrier and form the electric sensor signal instead of electrons. Embodiments are directed to both doping designs unless anything else is explicitly noted, even though figures may implicitly show only one design and only one design is described with respect to the figures.

In other words, a resistive surface pinning layer 10a, 10b is integrated below the modulation gate structures 8a, 8b. The construction can be considered a pinned photogate (PPG) device.

In embodiments, the resistive surface pinning layer fulfils the following conditions.

The doping level should be sufficiently high, as indicated above preferably above $10^{14}$ atoms/cm$^3$, to prevent depletion of the oxide interface 20 when the read-out nodes are biased. If the doping level comprises the aforementioned height, a generation of the minority carriers at the modulation gate or the oxide interface is prevented or at least significantly reduced. Therefore, a dark current caused by the generation is reduced. Moreover, an aspect to reduce recombination may be to avoid a (deep) source-drain implantation into the semiconductor substrate 14. Therefore, there is no direct contact of the control electrode 8 to the semiconductor substrate 14 and recombination of the minority charge carrier at the interface of the substrate to the control electrode may be even more reduced or even completely avoided.

The resistivity of the resistive surface pinning layer 10*a*, 10*b*, such as an electric connection between the control electrode 8*a* and the further control electrode 8*b* should be sufficiently high, such that, in conjunction with the gate capacitances 28*a*, 28*b*, the modulation gate voltage pulses capacitively coupled into the resistive layer 10 persists over the entire modulation period ($2\pi RC \gg 1/f\_mod$). Typical modulation frequencies f_mod are between 10 MHz and 300 MHz, between 50 MHz and 200 MHz or preferably between 75 MHz and 125 MHz, such as, for example, 100 MHz. In other words, to obtain charged capacitances during the measurement of the electromagnetic signal, the modulation frequency f_mod should preferable be above 1/(RC). Moreover, a higher value of RC enables using lower demodulation frequencies at lower power input.

The region 10 should be connected to a supply of majority carriers 16*b*, for example the enhanced doping region 26, in order to prevent long-term potential drift.

A thickness of the isolating material 20 is one design parameter to adjust the minimum modulation and demodulation frequency, since a thinner gate oxide increases the capacitance C of the same which may be referred to as gate oxide capacitance. A higher capacity may allow for a lower minimum demodulation frequency of approximately in the same order. Nonetheless, a thickness of the isolating material may be above 1.5 nanometers. Such a thickness may prevent electrons, or in general charge carriers, from tunneling through the gate oxide 20 and therefore bypassing the capacitance of the isolating layer.

A second parameter is the resistance of the doping region. For example, if the doping region is continuous between the control electrodes, the resistance R may be lower when compared to a discontinuous doping region. Therefore, a maximum gap width 32 between the modulation gates 8*a*, 8*b* may allow for a high resistance and therefore to drop the minimum demodulation frequency even further. The gap width may be directly related to a gap between the corresponding distinct doping regions 10*a*, 10*b*, since the doping regions are formed in a projection of the modulation gates into the semiconductor substrate. The projection of the control electrode may be projected in a direction towards the conversion region. In other words, the projection may be set perpendicular to a main surface area, wherein the main surface area is located in a direction of the greatest expansion of the control electrode. In other words, the projection of the control electrode may be projected perpendicular to a greatest interface or boundary region between the control electrode and the isolating material.

If the projection of the control electrode is completely covered or enclosed by the doping region, an occurrence of a space-charge region in the semiconductor substrate 14 is prevented. Nonetheless, even if the projection is not completely covered, for example only covered by more than 80% or in some embodiments more than 90% or even 95%, a space-charge region in the semiconductor is remarkably reduced. Nonetheless, a current may be induced in the semiconductor substrate if a size of the projection of the control electrode extends the size of the doping region and, therefore, the projection is not completely covered by the doping region.

The e/h pair generation at the interface 20 may be "quenched" when the majority carrier capture rate (proportional to the majority carrier concentration) exceeds the majority carrier emission rate. It may be realized when the interface 20 is not depleted, even for comparatively low doping concentration of the resistive pinning layer. This principle may be applied for those photogates that are actively modulated during operation, such as the modulation gate 8*a*, 8*b*.

According to a further embodiment, the optical sensor device comprises a separation gate 30, wherein a separation gate 30*a* may provide an electric potential distribution between the modulation gate 8*a* and the readout node 6*a* and, wherein the separation gate 30*b* performs the same with the modulation gate 8*b* and the readout node 6*b*. In other words, the separation gate allows for capacitive decoupling of the control electrodes 8*a*, 8*b* and the read-out nodes 6*a*, 6*b*, respectively, to prevent crosstalk or biasing from the control electrode to the read-out node.

Moreover, a distance or gap 32 between the modulation gate 8*a* and the further modulation gate 8*b* may be varied. Therefore, it is not required to have a small gap 32 since a minimum-width gap between the modulation gates is no longer needed to ensure swift lateral carrier transport. In detail, a more flexible gate layout is possible and a large gap may be provided according to some embodiments. A large gap allows that the contacts and the modulation gates are not in an optical path of the electromagnetic signal. Therefore, the electromagnetic signal impinging on the semiconductor substrate may comprise more energy if no electrodes are located in the direction of propagation of the electromagnetic signal. This effect may be greater for small wavelengths of the electromagnetic signal.

In this case the gates should, strictly speaking, no longer be referred to as photogates as they are not in the optical path between illumination source and absorption region anymore. Rather, they can be considered "modulation coupling gates". Furthermore, pulsation of the modulation gates creates a voltage drop across the resistive layer 10 enabling the modulation of minority carriers even if the bulk (epi) 14 is not depleted. The minority carrier re-direction is then governed by the majority carrier drift field that extends deeply into the bulk and might improve a tradeoff between the modulation speed and depth of the absorption region. This approach does not require extremely low doping concentrations below e.g. $5*10^{12}$ atoms/cm$^3$, prompting for expensive equipment and process control.

In other words, instead of depleting a region at the surface 18 of the semiconductor substrate, a (alternating) current 24 may be capacitively coupled into the doping region forming a potential gradient over the (imaginary) resistor within the electrical connection between the modulation gates. Having a continuous doping region between the modulation gates, the resistance between the control electrodes may be smaller when compared to distinct doping regions 10*a*, 10*b*, where the current is provided through areas of the semiconductor substrate comprising a lower doping concentration when compared to the doping region.

FIG. 2B shows an exemplary potential gradient or potential curve 34 which may be derived from the electric field generated by the current 24. Potential gradients (or drift fields) 34*a*, 34*b* affecting electromagnetic signals having a phase shift of e.g. 180° are exemplary indicated. The potential curve 34a may effect charge carriers generated from the electromagnetic signal having a first phase such as 0°, wherein the second potential curve 34b may be relevant for charge carriers generated by the electromagnetic signal having the second phase such as 180°. Therefore, a rectangular demodulation may be applied. However, any other modulation technique such as e.g. analog, amplitude, frequency, phase, digital, PSK (phase-shift keying), QAM (quadrature amplitude modulation), OFDM (orthogonal frequency division multiplexing) modulation may also be used. Referring to the potential curve 34a, a charge carrier generated by the electromagnetic signal having the first phase is provided to the left side of FIG. 2B, i.e., in a direction towards the read-out node 6a. During shifting, the charge carrier leaves the area of influence of the electric field or at least, the influence will be reduced if the charge carrier leaves the conversion region. The charge carriers may be attracted by the separation gate 30a. Furthermore, the charge carrier may be attracted by the read-out node 6a. The same applies analogously to charge carriers generated by the electromagnetic signal having a further phase by applying the respective potential curve. The charge carriers collected at the read-out nodes may be read out using a suitable read-out circuit. An optical sensor device having only one read-out node 6a may be referred to as a one-tap pixel, wherein an optical sensor device having two read-out nodes to provide photo-generated charge carriers generated by the inbound electromagnetic signal at a first and a second phase may be referred to as a two-tap pixel.

FIG. 3 shows an exemplary structure of such a read-out circuit that may optionally be applied to the optical sensor device or it may optionally become part of the optical sensor device (pixel). The exemplary read-out circuit 300 may be formed using field effect transistors (FET). After the integration time where photo-generated carriers are generated by the electromagnetic signal, the integration node voltage, such as the voltage at the read-out node, may be sensed by a gain stage 302. This may be a FET in a source-follower layout, configured to read the charge carriers provided by the read-out node. The signal may be further analyzed, for example, through a select FET 304 connected to an analog-to-digital converter (ADC) input stage (not shown), as indicated in the 4T-A/4T-B blocks 306a, 306b. Initially, the integration node or read-out node may be charged to the reset voltage 308 using the reset switch 310. A further hold switch 312 may be used to disconnect the optically sensitive read-out node of the sensor from the gain stage 314 to allow for a signal conversion at a later time without impact of the conversion delay on the signal level (global shutter). The read-out node may form a diode indicated e.g. by a p-n junction.

In other words, using the hold switch 312, the charge carriers are collected in the read-out node and derived therefrom once after the integration time such that an optionally more time consuming evaluation of the sensor signal may be performed with a defined number of charge carriers and not with a constant flow of charge carriers.

The upcoming FIGS. 4 to 15 show a schematic cross-sectional view of the optical sensor device according to a number of embodiments. Herein, embodiments comprising a transfer gate are shown. Referring back to the exemplary read-out structure of FIG. 3, the transfer gate may perform the task of the hold switch 312 (the hold switch may be removed) to enable or disable a read-out of the photo-generated charge carriers and to provide the charge carriers to e.g. an amplification stage for further processing. Nonetheless, the transfer gates allow for noise-free read-out of the charge carriers wherein noise induced during reset of the pixel may be eliminated using correlated double sampling. Therefore, using transfer gates instead of the hold switch 312, a signal-to-noise ratio of the sensor signal (formed by the photo-generated charge carriers) may be improved.

The embodiment of FIG. 4 reveals two control electrodes 8a, 8b being spaced apart by the gap 32. Furthermore, the doping regions 10a, 10b below the respective control electrodes comprise a gap of approximately the same size of the gap 32. Using this structure, a comparatively high resistance between the distinct doping regions 10a, 10b may be achieved. Moreover, FIG. 4 reveals an area 35 in the conversion region 12 comprising a doping of the other kind when compared to the doping of the semiconductor substrate 14. The minimum doping concentration of the conversion region 12 shall be small when compared to e.g. the doping concentration of the doping regions 10. A sufficiently small doping concentration enables a (complete) depletion of the conversion region using diode- and/or gate potentials (e.g. a potential applied to the separation gate(s) or the storage gate(s)). Using this area 35 having a complementary doping than the substrate contact 26, the resistance between the doping regions 10a, 10b increases without influencing the capacitance 28a, 28b and therefore increasing the value (or product) of RC enabling using lower demodulation frequencies at lower power input.

Figure 5:
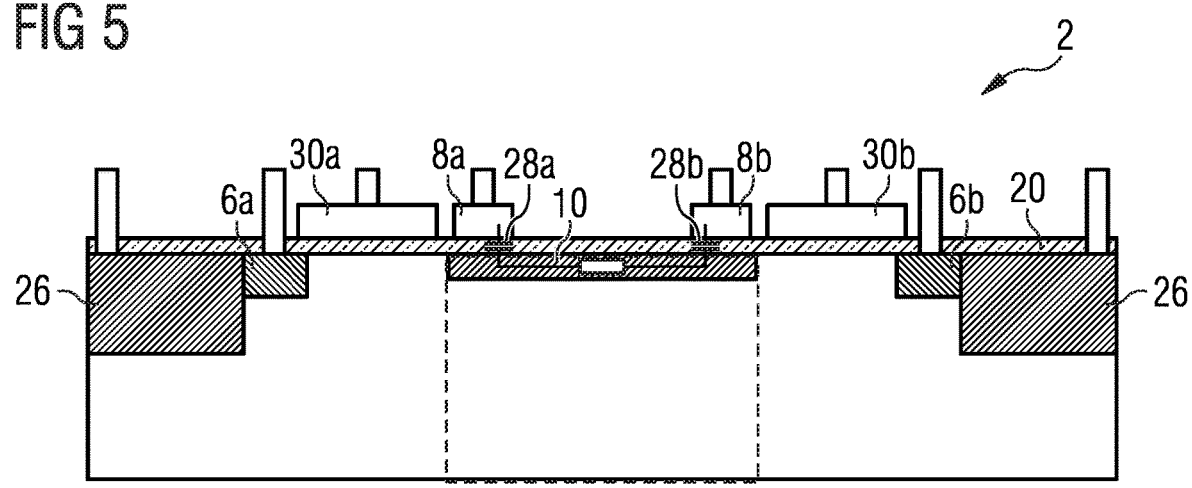
FIG. 5 shows a schematic cross-sectional view of the optical sensor according to one of a number of embodiments with two control electrodes being separated by a large gap and having a continuous doping region below the control electrode.

FIG. 5 shows the optical sensor device 2 of FIG. 4 without the further doping region 35 and with a continuous doping region 10 below and between the control electrodes 8a, 8b. The absence of the area 35, indicated in FIG. 4, may be procedurally effective, since a further doping step may be avoided.

FIG. 6 shows the embodiment of FIG. 5, however with the control electrodes 8a, 8b having a smaller gap 32. Due to the smaller gap, the gate capacitances may increase.

FIG. 7 shows the embodiment of FIG. 6, however using only one half or a part of the optical sensor device 2. The remaining part without electrodes attached is depicted to indicate the similarity to the described embodiments, however, the optical sensor device may be downsized or the remaining part may be cut off to obtain a smaller optical sensor device. Therefore, the substrate contact 26 may serve as the second doping region such that the alternating current 24 provided or impressed in the semiconductor substrate 14 may be conducted from the doping region 10a to the substrate contact 26. Thus, a phase sensitive demodulation may be achieved for a single phase of the electromagnetic signal. To obtain a meaningful time-of-flight measurement, information from the electromagnetic signal may be gained at three different phase shifts. Using the embodiments having two distinct control electrodes 8a and 8b, two measurements should be performed to retrieve information from four different phases of the electromagnetic signal. However, three different measurements shall be performed according to the embodiment of FIG. 7 to obtain the information from three different phases of the electromagnetic signal. In applications where a small size of the sensor is desired, such an increase of the measurement time may be accepted or neglected to achieve the small sensor design.

Figure 8:
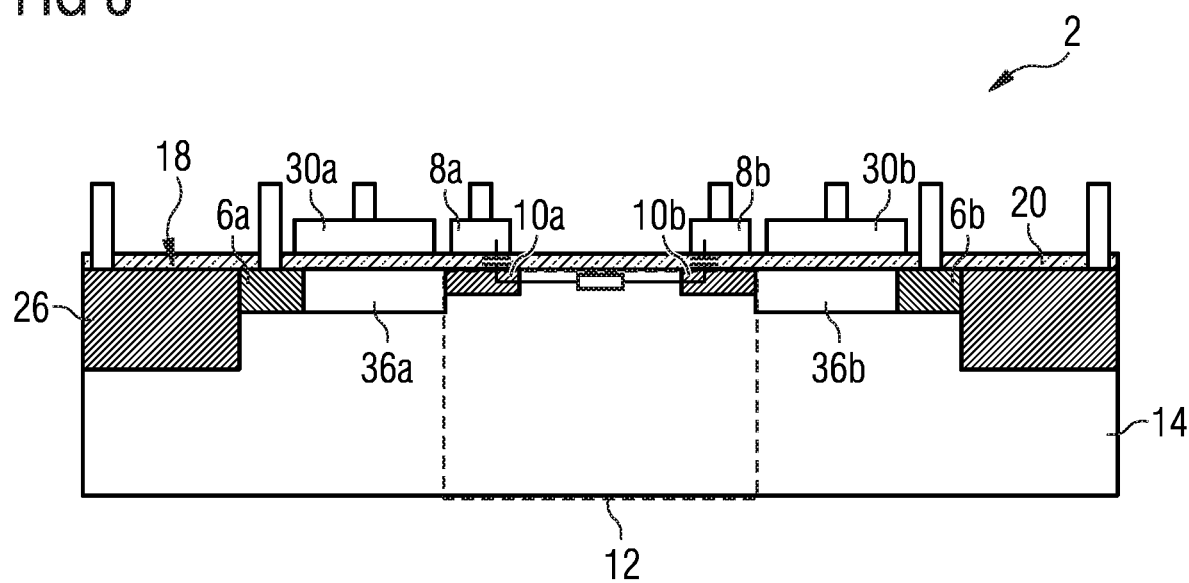
FIG. 8 shows a schematic cross-sectional view of the optical sensor device according to one of a number of embodiments having a buried channel adjacent to the read-out node.

FIG. 8 shows an embodiment of the optical sensor device similar to the embodiment of FIG. 4. However, the further doping region 35 is absent wherein buried channels 36a, 36b are provided in the semiconductor substrate 14. The buried channels 36a, 36b may be generated by implanting doping atoms of the kind of the doping atoms used to dope the read-out nodes (e.g. n-doped). However, the doping is complementary to the doping of the substrate contact 26. The doping concentration of the buried channels may be smaller than the doping concentration in the read-out node such as between $10^{12}$ and $10^{18}$ atoms/cm$^3$ or between $1*10^{14}$ and $1*10^{17}$ atoms/cm$^3$ or between $1*10^{15}$ and $1*10^{16}$ atoms/cm$^3$. Using the buried channels, the charge carriers generated by the electromagnetic signal may be guided through the buried channel to the read-out node. Therefore, less charge carriers reach the main surface area 18 of the semiconductor substrate 14, where it would be more likely that the charge carriers recombine or get trapped before they are read out by the read-out node. Thus, using the buried channel, more charge carriers may reach the read-out node. In other words, the optical sensor device comprises a buried channel 36 in the semiconductor substrate between the conversion region 12 and a respective read-out node 6a, 6b to obtain an increased read-out efficiency of the optical sensor device 2. In one embodiment, semiconductor substrate 14 and substrate contact 26 are p-doped with the substrate contact 26 having a higher doping concentration than semiconductor substrate 14 and the buried channels 36a, 36b and the read-out nodes 6a, 6b are n-doped with the read-out nodes 6a, 6b having a higher doping concentration than buried channels 36a, 36b.

Figure 9A:
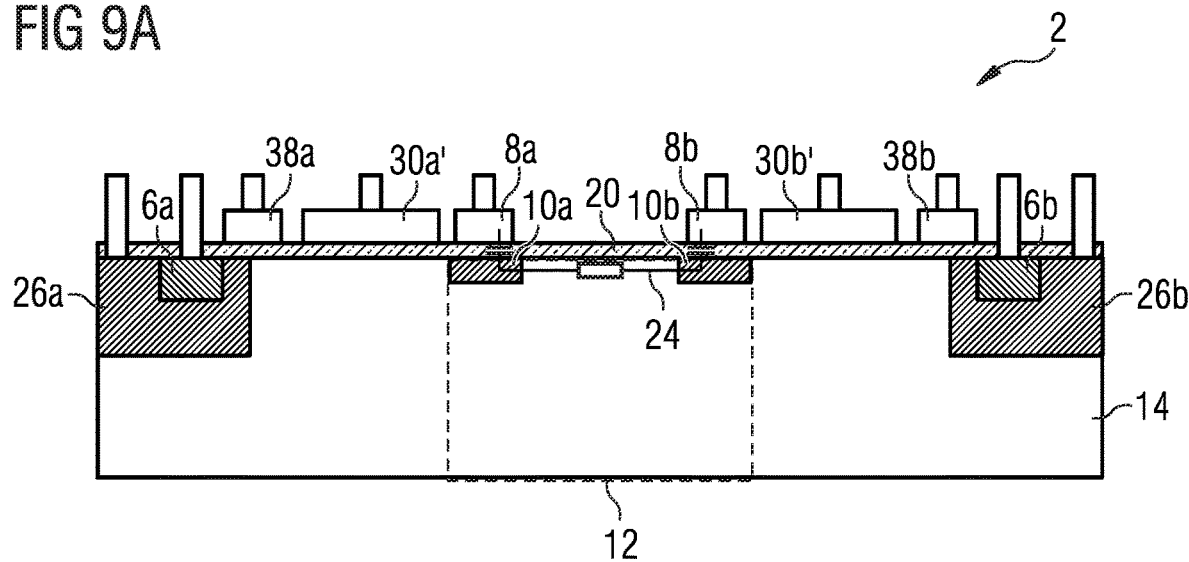
FIG. 9A shows a schematic cross-sectional view of the optical sensor device according to one of a number of embodiments having a storage gate and a transfer gate between the read-out node and the control electrode.

FIG. 9A shows a modification of the embodiment of FIG. 2A comprising a transfer gate 38a, 38b located between a storage gate 30a' and the read-out node 6a. The transfer gate 38b is located accordingly between a storage gate 30b' and the read-out node 6b. Moreover, the read-out node 6a may be embedded in the substrate contact 26a and the further read-out node 6b may be embedded in the further substrate contact 26b. The storage gates 30a', 30b' may be, from the hardware or design point of view, equal to separation gates 30a, 30b described with respect to other embodiments. However, from a functional point of view, the storage gate is configured to collect the charge carriers provided from the conversion region to avoid a direct read-out by the read-out node. The direct read-out is prevented by the enhanced doping region of the substrate contact 26a, 26b covering or enclosing the read-out node 6a, 6b. However, the transfer gate 36a, 36b may be configured to bridge or bypass the enhanced doping region 26a, 26b below the transfer gate (or between the read-out node and the storage gate) to enable a read-out of the collected charge carriers below the storage gate 30a'. Therefore, the transfer gate may enable the transfer of the charge carriers to the read-out node.

Furthermore, conversion capacitances (e.g. introduced by a diode comprising the read-out node and the read-out circuit) may be reduced due to the transfer gate. In other words, the integration capacitance is reduced leading to higher signal voltages at a given optical signal and integration time. The capacitance is reduced, since it is formed by the diode in the sensor (n+ region with respect to the substrate, the reset diffusion-to-gate and bulk capacitances, and the source follower input capacitance). Therefore, the capacitance does not rely on a diode in the sensor additionally comprising the n+ region with respect to a separation gate and to a hold switch diffusion to gate and bulk capacitance. Having a reduced integration or conversion capacitance, a faster read-out of the photo-generated charge carriers is enabled since a reduced capacitance has to be loaded before the signal can be derived.

Furthermore, a hold switch, such as e.g. the hold switch 312 of the read-out circuit may be removed, since the transfer gate enables or disables the charge carriers to be directed to the read-out circuit. Therefore, the so-called kTC noise (or thermal noise or Johnson-Nyquist noise) of the hold switch is absent since the hold switch is removed. However, due to a switching of the reset gate, kTC noise is still induced. However, this kTC noise can be removed using correlated double sampling (CDS). This is possible, since no hold switch will provide a random voltage noise component at the input of the source follower (sqrt(kT/C)) due to the (dissipative) charge exchange between the capacitance and the integration node through the hold switch MOS-channel resistance. In other words, since there is no separate switch between the gain stage and the read-out node during read-out, the same amount of noise occurs during reset and during read-out, such that the noise impact during reset and during read-out cancels when the two readings are subtracted.

Figure 9B:
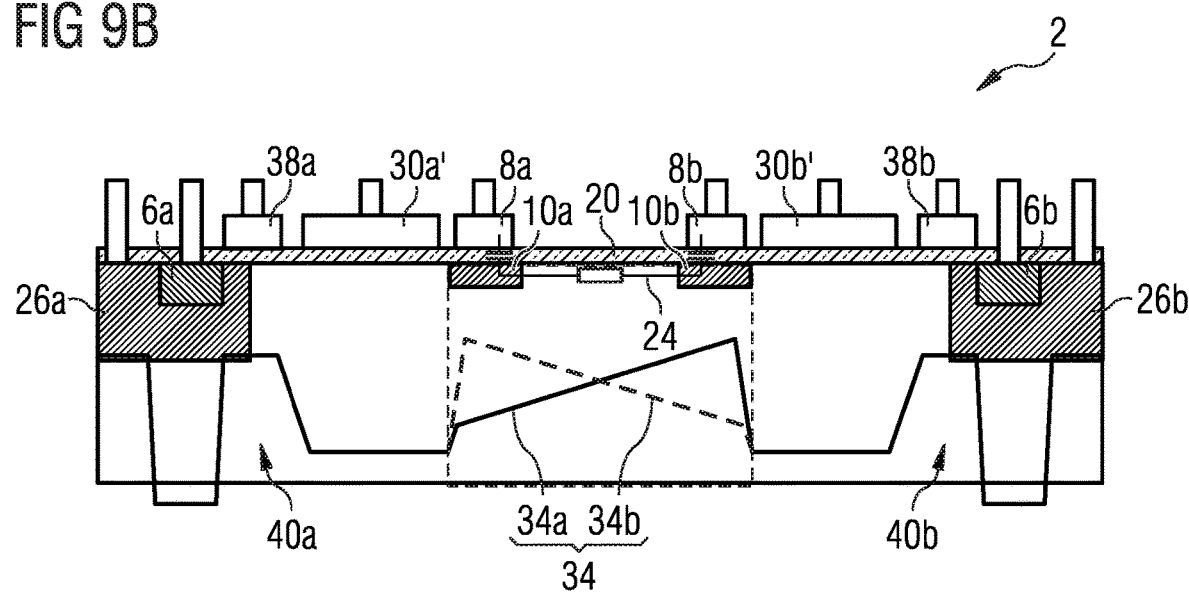
FIG. 9B shows a schematic illustration of a potential distribution of one of a number of embodiments of the optical sensor device with a transfer gate.

An exemplary potential curve 34 is shown in FIG. 9B, which is similar to the potential curve of FIG. 2B. However, a difference is the potential barrier 40a, 40b below the transfer gates. This potential barrier may be caused by the extended doping of the substrate contact covering the read-out node during a conversion or sensing mode of the optical sensor device. The potential barrier may be substantially decreased by the transfer gate 38a, 38b during read-out to enable a read-out of the photo-generated charge carrier. In other words, the optical sensor device may comprise, in embodiments, a transfer gate 38a, 38b configured to provide the photo-generated charge carriers to the read-out node in a read-out mode of the optical sensor device and to separate the photo-generated charge carriers from the read-out node in a sensing mode of the optical sensor device.

Figure 10:
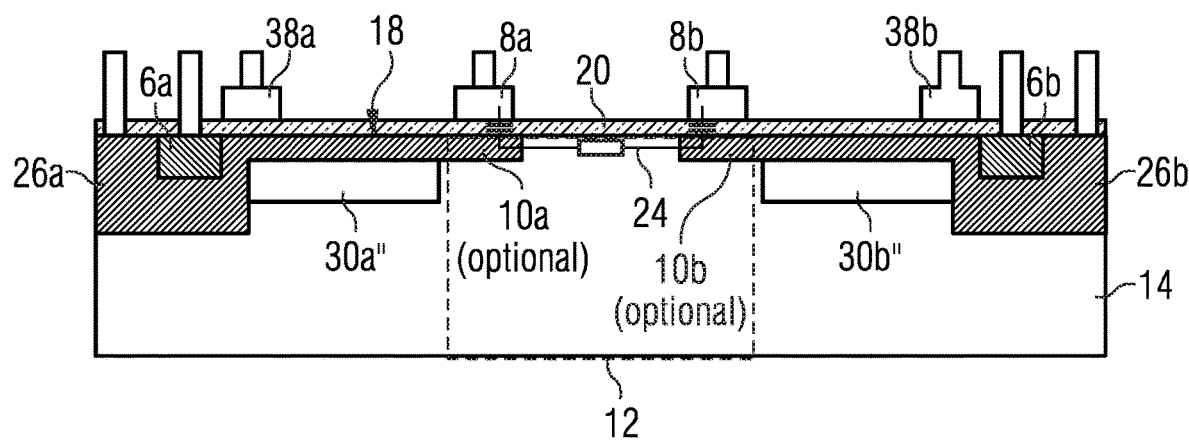
FIG. 10 shows a schematic cross-sectional view of the optical sensor device according to one of a number of embodiments with a pinned-diode storage well.

FIG. 10 shows an alternative example of FIG. 9A, wherein the storage gate 30a', 30b' at the semiconductor substrate (or more precise, above the isolating layer 20) is replaced by a pinned storage well 30a", 30b" in the semiconductor substrate. The pinning, which may be performed by an enhanced doping region (provided by doping regions 10a, 10b) between the storage well 30a" and 30b" and the main surface area 18 of the semiconductor substrate 14, may prevent the charge carriers collected in the storage well from recombination at the main surface area 18. Furthermore, the pinned storage well may prevent a generation of charge carriers in the semiconductor substrate at the main surface area and therefore, the pinned storage well reduces or even suppresses a generation of a leakage current at the main surface area. Again, the transfer gate 38a, 38b may reduce the potential barrier between the storage well 38a" and the read-out node 6a in a read-out mode of the optical sensor device. The storage well may be a depleted region of the semiconductor substrate. According to FIG. 10, the doping regions 10a, 10b provide in addition to already described functionality also a pinning of the storage well 30a", 30b". In one embodiment, semiconductor substrate 14 and substrate contacts 26a, 26b are p-doped with the substrate contacts 26a, 26b having a higher doping concentration than semiconductor substrate 14. The storage wells 30a", 30b" and the read-out nodes 6a, 6b are n-doped with the read-out nodes 6a, 6b having a higher doping concentration than storage wells 30a", 30b".

Figure 11A:
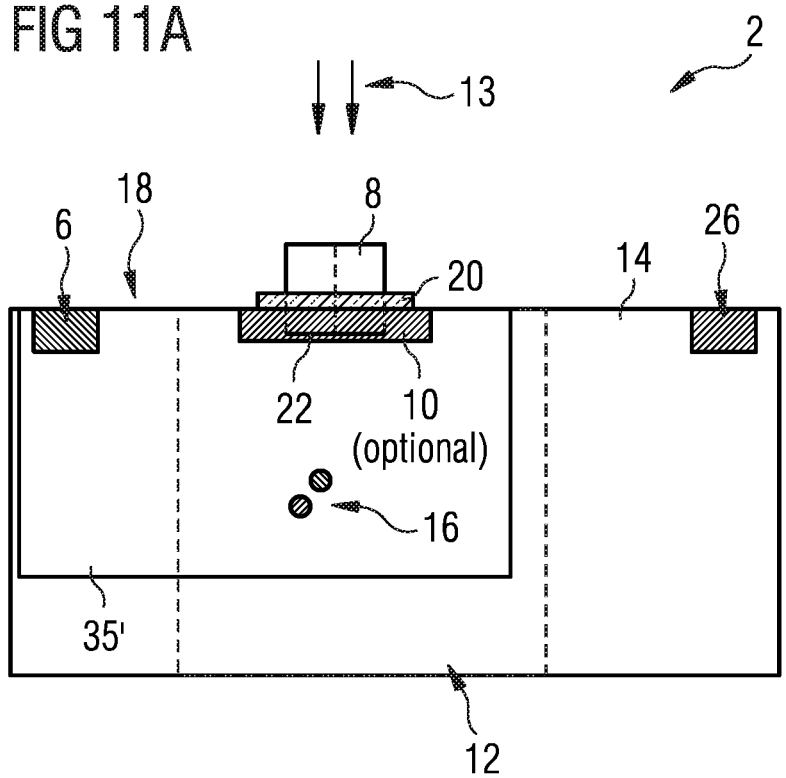
FIG. 11A shows a schematic cross-sectional view of the optical sensor device according to one of a number of embodiments with a modified doping concentration of an implanted well in the semiconductor substrate.

FIG. 11A shows a schematic cross sectional view of the optical sensor device 2 according to embodiments such as a time-of-flight sensor device. The optical sensor device comprises a semiconductor substrate 14 comprising a conversion region 12 to convert an electromagnetic signal 13 into photo-generated charge carriers 16 and a read-out node 6 configured to read-out the photo-generated charge carriers 16. Moreover, the optical sensor device comprises a control electrode 8 which is separated by an isolating material 20 from the conversion region 12. An optional doping region 10 may be formed in the semiconductor substrate 14 between the control electrode 8 and the conversion region 12, wherein the optional doping region 10 comprises a higher doping concentration compared to the conversion region 12, wherein the doping concentration is at least 1000 times higher than the minimum doping concentration of the conversion region 12 and wherein the doping region 10 extends into the semiconductor substrate 14. However in other variants of the embodiment of FIG. 11A, the doping region 10 may also be omitted or may have other doping concentrations. A substrate contact 26, for example an enhanced doping region, may be provided in the semiconductor substrate 14.

The optical sensor device according to FIG. 11A comprises a vertical extending doping region 35' which is formed in the semiconductor substrate adjacent to the read-out node 6 and the control electrode 8. The vertical extending doping region 35' may be laterally bounded. In one embodiment, each optical sensor device may be one of a plurality of optical sensor devices each comprising a vertical extending doping region 35' associated with the optical sensor device. In another embodiment, a plurality of pixel may share a same vertical extending doping region 35'. At least a part of the vertical extending doping region 35' is located within the conversion region, therefore providing a conversion of at least a portion of the electromagnetic signal 13 into the photo-generated charge carriers 16. In some embodiments, the lateral extension of the vertical extending doping region 35' may be beyond the lateral extension of the conversion region. A doping type of the vertical extending doping region 35' is different from a doping type of the substrate contact 26. Furthermore, according to embodiments, the doping type of the vertical extending doping region 35' may be the same as the doping type of the read-out node 6. The conversion of the electromagnetic signal 13 into photo-generated charge carriers 16 may at least partially be within the vertical extending doping region 35'. Furthermore, the photo-generated charge carriers may be guided to the read-out node 6 within (or through) the vertical extending doping region 35'. The vertical extending doping region 35' may be biased by an electric potential such that a depletion region extends fully throughout the vertical extending doping region 35' or at least partially such that the depletion region extends to the read-out node 6. Furthermore, the read-out node 6 and vertical extending doping region 35' may comprise the first doping type, wherein the (optional) doping region 10 and the substrate contact 26 may comprise the second doping type. The first and second doping types are complementary doping types.

At least some of the photo-generated charge carriers may not leave the vertical extending doping region 35' until they reach the read-out node 6. Therefore, the photo-generated charge carriers may be generated in the vertical extending doping region 35' and provided (or transported) to the read-out node through or within vertical extending doping region 35'. According to embodiments, there may be only one vertical extending doping region 35' formed in the optical sensor device.

The vertical extending doping region 35' provides for an increased demodulation efficiency in vertical deeper lying regions and therefore the demodulation of the photo-generated carriers is provided deeper in the substrate. This in-volume demodulation avoids long path lengths and slow diffusive transport. At the transition to the non-depleted substrate, a high electric field strength is obtained which provides for a fast extraction of the generated minority carriers. In other words, the vertical extending doping region contributes at least partially to a demodulation efficiency of the optical sensor device.

Furthermore, buried channels may no longer be needed with the vertical extending doping region 35'.

To achieve the above described effects, the vertical extending doping region 35' may have a doping concentration in the range between $10^{12}$ atoms/cm$^3$ and $10^{15}$ atoms/cm$^3$. In some embodiments the doping concentration may be in the range between $10^{13}$ atoms/cm$^3$ and $10^{14}$ atoms/cm$^3$. The aspect ratio (maximum vertical extension of the vertical extending doping region 35' to a lateral extension of the conversion region 12) of the vertical extending doping region 35' may be between 0.2 and 5, in some embodiments between 0.5 and 2 and in some embodiments between 0.75 and 1.25.

According to an embodiment, the minimum doping concentration of the conversion region 12 in the semiconductor substrate 14 is within the vertical extending doping region 35'.

In some embodiments, the vertical extending doping region 35' may be an implanted well or a well generated by diffusion. In other embodiments, the vertical extending doping region 35' may be manufactured by an epitaxial growth with the doping type of the vertical extending doping region 35'. Regions outside of the vertical extending doping region 35' may then be counter-doped to obtain a lateral boundary and to allow the substrate or a buried layer in the substrate to be electrically connected.

Figure 11B:
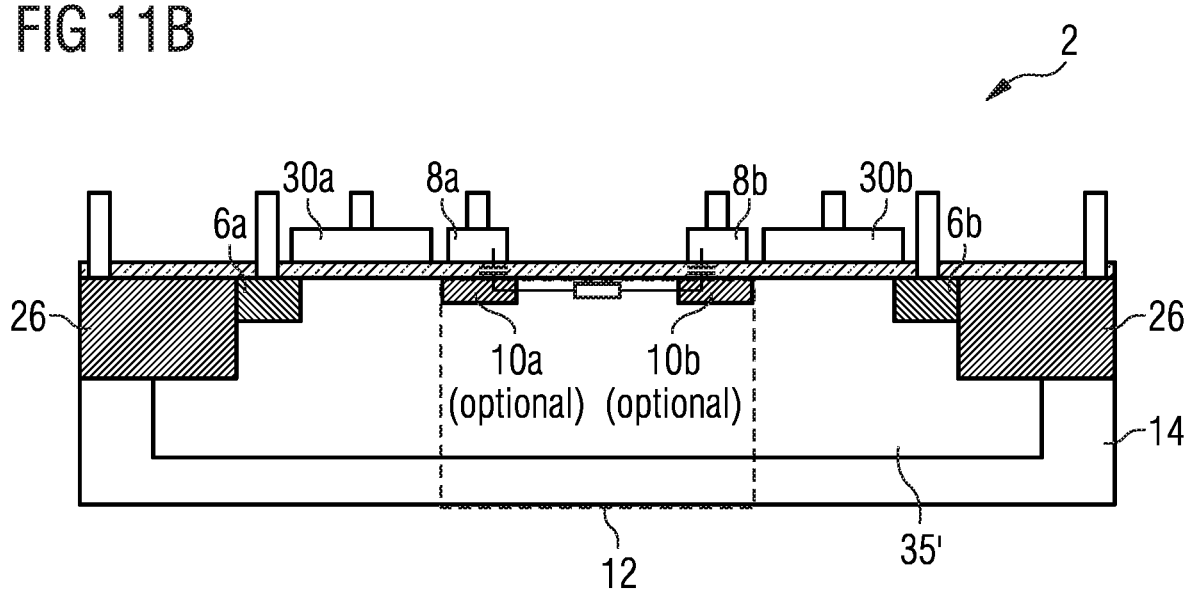
FIG. 11B shows a schematic cross-sectional view of the optical sensor device according to one of a number of embodiments modifying FIG. 11A.

FIG. 11B shows the optical sensor device 2 with the vertical extending doping region 35' similar to the one described with respect to FIG. 4 and further in a modification of FIG. 11A. However, compared to FIG. 4, the vertical extending doping region 35' is not limited to the conversion region 12. Therefore, the further doping region 35' may be formed in an active area of the optical sensor device. The active area may be the part of the optical sensor device where (minority) charge carriers contributing to the sensor signal occur. In other words, these charge carriers may not leave the active area and therefore the further doping area 35'. Nonetheless, the majority charge carrier may optionally leave the further doping area 35' to be guided to the substrate contact 26.

Figure 12:
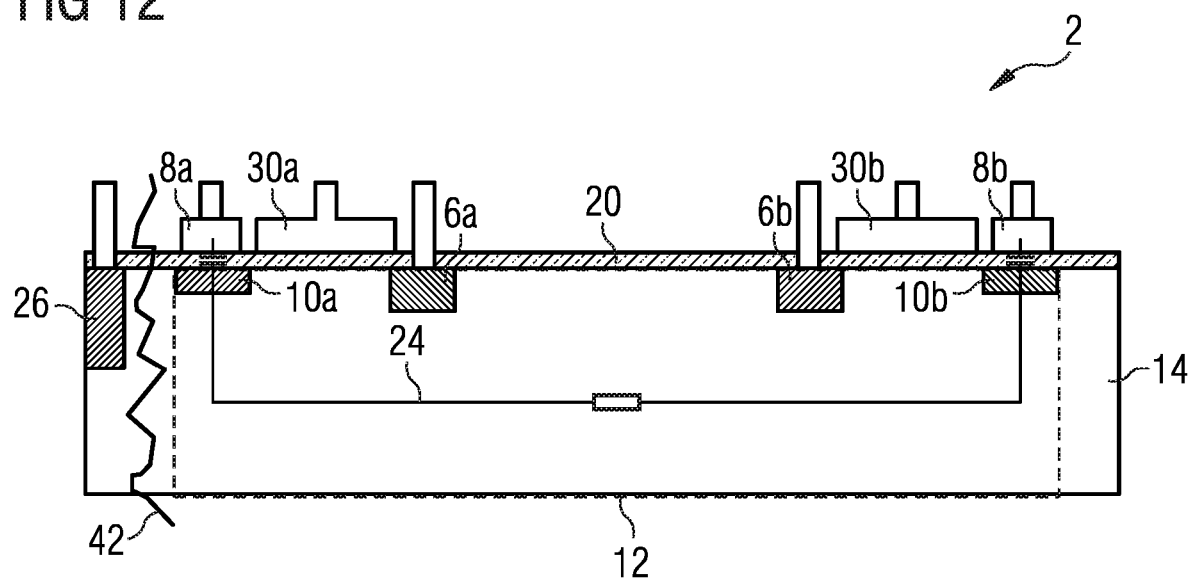
FIG. 12 shows a schematic cross-sectional view of the semiconductor substrate according to a further embodiment having two control electrodes separated by read-out.

FIG. 12 shows the optical sensor device wherein a position of the read-out node and the control electrode is interchanged. Therefore, the alternating current 24 passes both read-out nodes 6a, 6b and the respective separation gates 30a, 30b. Nonetheless, in some embodiments, a resistance between the semiconductor contact 26 and the doping region 10a, 10b is greater than the resistance between the two doping regions 10a, 10b. Therefore, line 42 schematically illustrates that the substrate contact 26 and the doping region 10a are spatially separated or additionally or alternatively that other means for increasing the resistance are implemented.

Figure 13A:
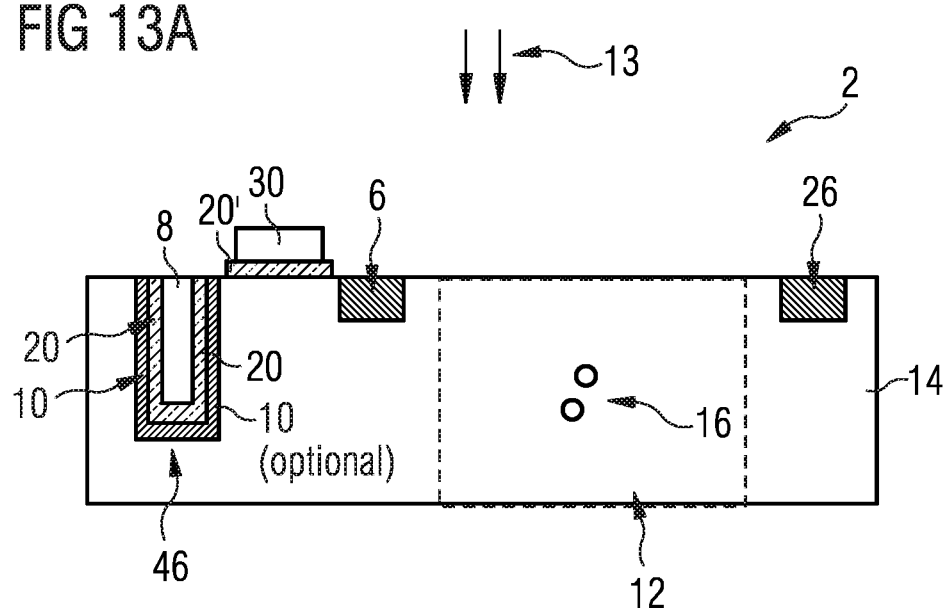
FIG. 13A shows a schematic cross-sectional view of the optical sensor device according to one of a number of embodiments wherein the control electrodes are formed in a trench.

FIG. 13A shows a schematic cross-sectional view of the optical sensor device 2 such as an optical time of flight sensor device. The optical sensor device comprises a semiconductor substrate 14, the semiconductor substrate comprising a conversion region 12 to convert an electromagnetic signal 13 into photo-generated charge carriers 16. The optical sensor device further comprises a read-out node 6 configured to read-out the photo-generated charge carriers 16 and a control electrode 8 which is separated by an isolating material 20 from the semiconductor substrate 14 and therefore separated furthermore from the conversion region 12. Moreover, the optical sensor device may comprise a separation gate 30 which is separated by an isolating material 20' from the semiconductor substrate 14. A substrate contact 26, for example an enhanced doping region, may be provided in the semiconductor substrate 14.

According to embodiments, an optional doping region 10 in the semiconductor substrate 14 may be located between the control electrode 8 and the conversion region 12, wherein the optional doping region 10 comprises a higher doping concentration compared to the conversion region 12, wherein the doping concentration is at least 1000 times higher than the minimum doping concentration of the conversion region 12 and wherein the doping region 10 extends into the semiconductor substrate 14. However in other variants of the embodiment of FIG. 13A, the optional doping region 10 may also be omitted or may have other doping concentrations. Furthermore, the read-out node 6 may comprise the first doping type, wherein the doping region 10 and the substrate contact 26 may comprise the second doping type.

Furthermore, the optical sensor device may comprise a separation gate 30. The separation gate 30 is electrically isolated by an isolating layer 20' (comprising an isolating material) from the semiconductor substrate 14. The control electrode 8 and the isolating material 20 may be formed in a trench 46 of the semiconductor substrate 14, wherein an extension of the trench into the semiconductor substrate perpendicular to a main surface region 18 is greater than a distance between the read-out node and the control electrode or, in embodiments, greater than a lateral extension of the separation gate. In some embodiments, the vertical extension of the trench into the semiconductor substrate may be at least the lateral distance between the trench and the read-out node 6. In some embodiments, the vertical extension of the trench into the semiconductor substrate may be at least the lateral extension of the separation gate 30. In some embodiments, the distance of the read-out node 6 to the gate structure 30 may be as close as possible so that an electrical isolation is provided between read-out node 6 and separation gate 30. The separation gate 30 may in some embodiments extend substantially the full lateral distance or at least a significant portion of the lateral distance between the control electrode 8 and the read-out node 6. In some embodiments, a projection of the control electrode 8 towards the conversion region 12 may overlap the doping region 10 or is located in the doping region. In other variants of FIG. 13A, the projection of the control electrode 8 towards the conversion region 12 may not overlap the doping region 10 or may not be located in the doping region. The trench may be formed using e.g. reactive ion etching.

The separation gate may allow for a capacitive decoupling of the control electrodes 8 and the read-out nodes 6 respectively, to prevent crosstalk or biasing from the control electrode 8 to the read-out node 6. In some embodiments, a projection of the modulation gate into the semiconductor substrate (perpendicular to the semiconductor substrate) is at least partially located between the trench (or the modulation gate) and the read-out node. In other words, the trench 46, the separation gate 30, the read-out node 6 and the conversion region 12 may be located in the aforementioned order. Thus, with respect to a vertical projection to the main surface region 18, the separation gate 30 is arranged between the read-out node 6 and the trench 46.

Figure 13B:
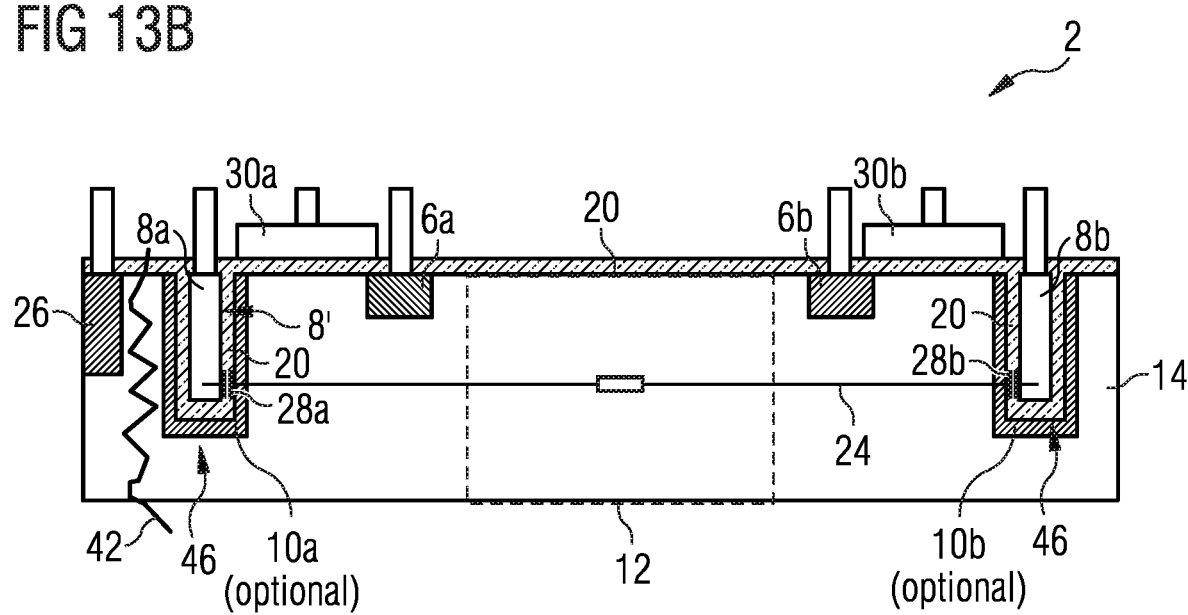
FIG. 13B shows a schematic cross-sectional view of the optical sensor device according to one of a number of embodiments modifying FIG. 13A.

FIG. 13B shows the optical sensor device of FIG. 12, wherein, as an alternative to FIG. 12, the control electrodes 8a, 8b are located in a trench or well 46 in the semiconductor substrate 14. A surface of the trench 46 may be covered using the isolating material 20. Adjacent to the isolating material, the doping region 10a, 10b may be formed in the semiconductor substrate. The control electrodes 8a, 8b are formed in the trench covered by the isolating material 20. Again, a comparatively high resistance between the substrate contact 26 and the control electrode 8a may be provided in embodiments, indicated by line 42. The separation gate may be a shield electrode at a constant potential to avoid a capacitive coupling of the modulation gate 8 to the read-out node 6. Instead of etching a trench using e.g. a (deep) reactive ion etch trench method ((D)RIE), a conventional etching (dry or wet) etching may be used to form the trench. This conventional etching may be economically more effective, since it is faster and low-priced in comparison to RIE methods.

In other words, the control electrode and the isolating material may be formed in the trench of the semiconductor substrate, wherein the isolating material separates the control electrode from the semiconductor substrate bounding the trench. Furthermore, the further control electrode may be formed in a further trench of the semiconductor substrate bounding the trench. The conversion region may be formed or located between the control electrode and the further control electrode.

Figure 14:
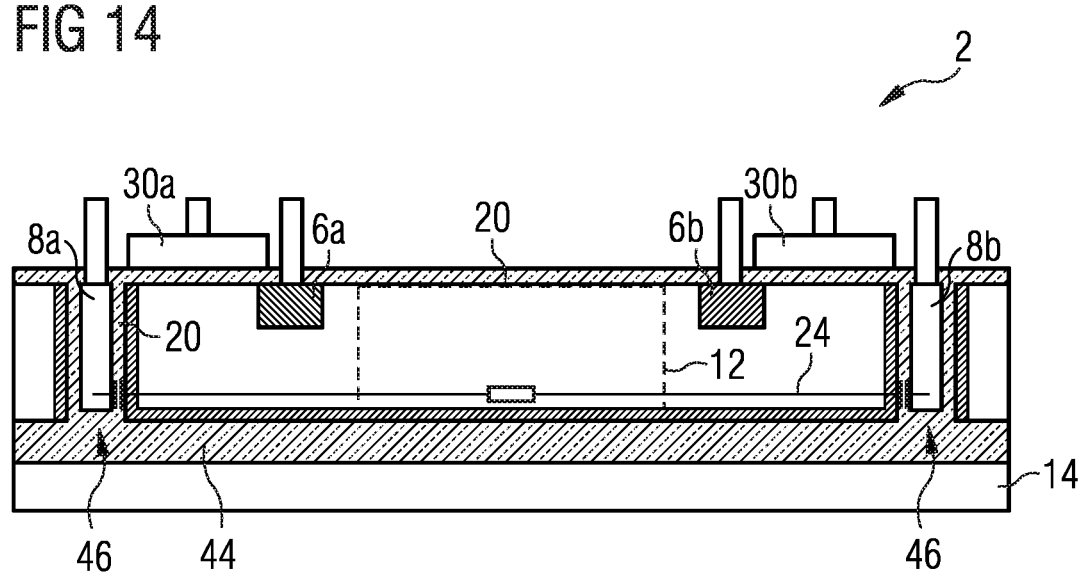
FIG. 14 shows the embodiment of the optical sensor device of FIG. 13B with an additional bottom oxide between two trenches limiting a depth of the conversion region in the semiconductor substrate.

FIG. 14 shows a further embodiment of a trench-based optical sensor device 2. In addition to the embodiment of FIG. 13B, a bottom oxide layer 44 is provided below the control electrodes 8a, 8b being connected to the isolating material 20 covering the trench 46. Therefore, the bottom isolating material 44 may be of the same material as the isolating material 20. Therefore, the demodulation area is limited by the further bottom isolating material 44. In other words, the embedded isolating material may be embedded in the semiconductor substrate extending from the trench to the further trench. The embedded isolating material, the trench, the further trench and the main surface region of the semiconductor substrate may form a boundary of the conversion region.

This embodiment may for example be provided if the optical sensor element is aligned with other optical sensor elements to an array of optical sensor elements. Therefore, each optical sensor element of the array of optical sensor elements is electrically separated from the other optical sensor elements such that a crosstalk between two adjacent optical sensor elements is avoided. Nonetheless, for each optical sensor device, a separate substrate contact may be provided. Alternatively, one substrate contact may be formed for multiple optical sensor devices. Such that a saturation of the semiconductor substrate with majority carriers is avoided and therefore, a continuous measurement may be obtained. The substrate contact for multiple sensor devices may for example be located at a connection point between four adjacent optical sensor devices.

Figure 15:
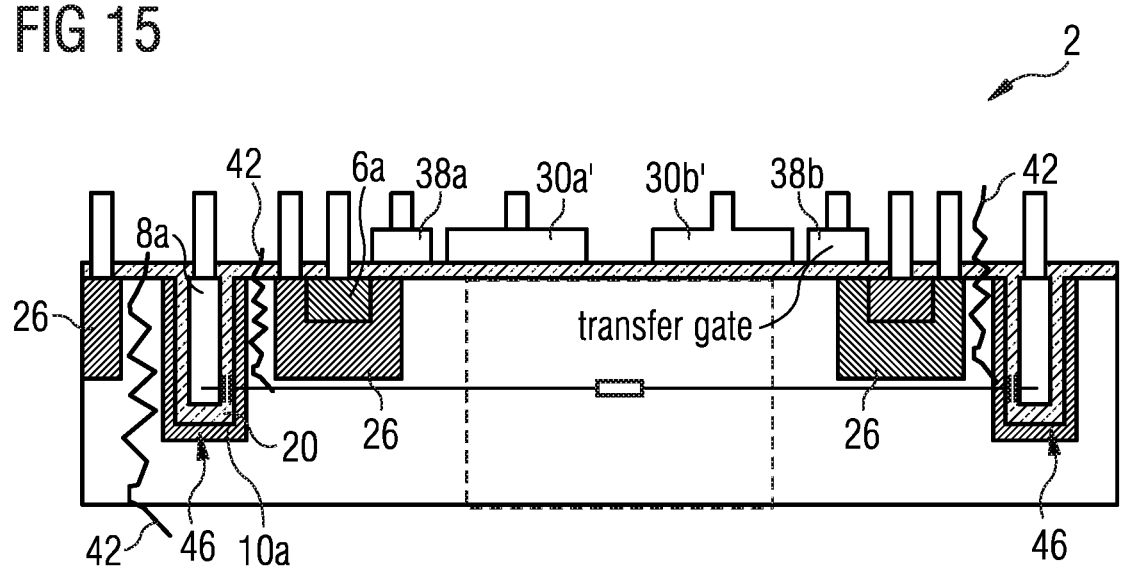
FIG. 15 shows a schematic cross-sectional view of the optical sensor device according to one of a number of embodiments combining the trench-based approach with the use of transfer gates.

FIG. 15 shows a further embodiment of the trench-based approach without bottom oxide layer 44 in a design with transfer gates 38a, 38b. Therefore, adjacent to the trench, the substrate contact 26 encloses the read-out node 6a and the semiconductor substrate. The transfer gate 38 is located between the read-out node and the storage gate 30a' to provide minority carrier from the storage region to the read-out node in a read-out node of the optical sensor device and to keep a potential barrier between the read-out node and the storage gate to allow a collection of the minority carrier below the storage gate electrode 30a'.

Figure 16:
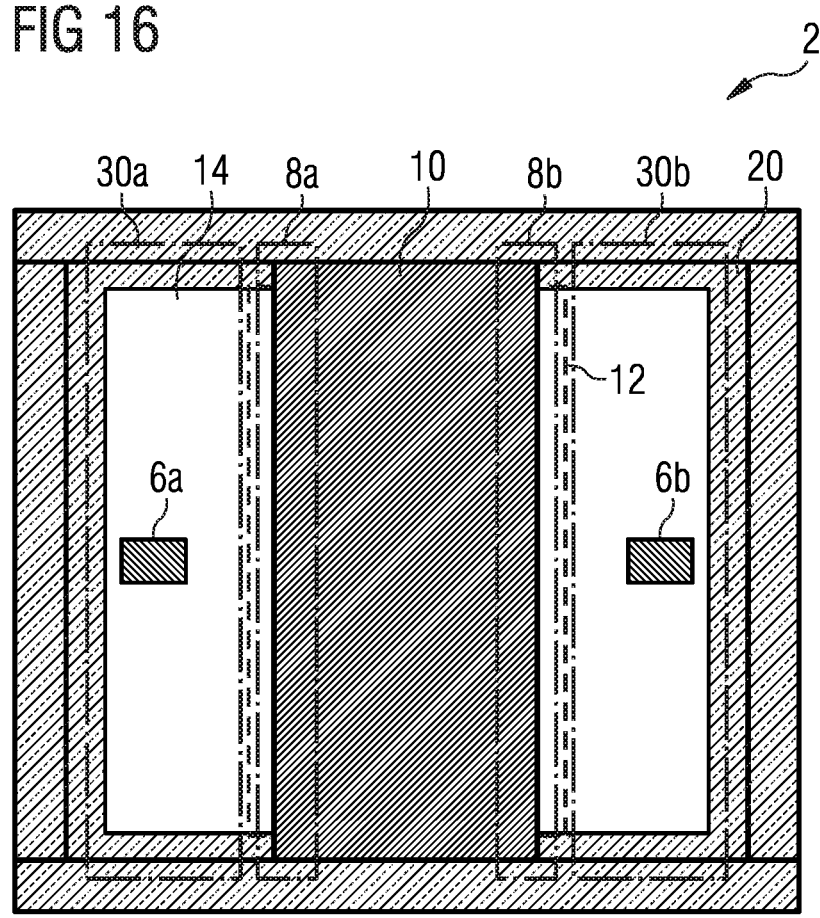
FIG. 16 shows a schematic top view of the optical sensor device according to one of a number of embodiments.

FIG. 16 shows a schematic top view sketch of the pinned photogate (PPG) device 2 with one possible realization of the connection between the resistive pinning layer 10 and the enhanced doping region (substrate) at top and bottom.

FIG. 17 shows a schematic block diagram of a method for manufacturing an optical sensor device 2. The method comprises a step S1702 of providing a semiconductor substrate comprising a conversion region to convert an electromagnetic signal into photo-generated charge carriers, a step S1704 of forming a doping region in the semiconductor substrate between the control electrode and the conversion region, wherein the doping region comprises a higher doping concentration compared to a minimum doping concentration of the semiconductor substrate in a region extending from the doping region into the semiconductor substrate by a distance of a maximum extension of the control electrode, wherein the maximum extension extends perpendicular to a direction of projection of the control electrode towards the conversion region, wherein the doping concentration is by at least 1000 times higher than the minimum doping concentration, wherein a projection of the control electrode towards the conversion region overlaps the doping region or is located in the doping region a step S1706 of separating a control electrode by an isolating material from the conversion region, and a step S1708 of providing a read-out node configured to read-out the photo-generated charge carriers. Separating the control electrode in step S1706 from the conversion region may be performed by depositing the isolating material at the main surface area of the semiconductor substrate and forming the control electrode on the isolating material. Therefore, an electrical connection between the semiconductor substrate and the control electrode may be prevented.

To be more precise, any doping of the semiconductor substrate may be performed by implanting doping atoms at a certain depth of the semiconductor substrate and further, to perform an oxidation process on the main surface area of the semiconductor substrate to form the isolating material 20.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present disclosure. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. An optical sensor device, comprising:
   a semiconductor substrate comprising a conversion region to convert an electromagnetic signal into photo-generated charge carriers;
   a read-out node configured to read-out the photo-generated charge carriers;
   a control electrode which is separated by an isolating material from the semiconductor substrate; and
   a doping region in the semiconductor substrate between the control electrode and the conversion region, wherein the doping region comprises a doping concentration that is higher as compared to a minimum doping concentration of the conversion region, wherein the doping concentration is at least 1000 times higher than the minimum doping concentration of the conversion region, wherein the doping region extends into the semiconductor substrate;
   wherein a projection of the control electrode towards the conversion region overlaps the doping region or is located in the doping region; and
   wherein the optical sensor device is a time-of-flight sensor.

2. The optical sensor device of claim 1, wherein the isolating material is configured to form a capacitor between the control electrode and the doping region.

3. The optical sensor device of claim 1, further comprising:
   a further control electrode which is separated by an isolating material from the semiconductor substrate; and
   a further doping region in the semiconductor substrate between the further control electrode and the conversion region, wherein the further doping region comprises a doping concentration that is higher as compared to a minimum doping concentration of the conversion region, wherein the doping concentration is at least 1000 times higher than the minimum doping concentration of the conversion region, wherein the doping region extends into the semiconductor substrate.

4. The optical sensor device of claim 3, wherein a projection of the further control electrode towards the conversion region overlaps the further doping region or is located in the further doping region.

5. The optical sensor device of claim 4, wherein the control electrode and the further control electrode are spatially separated, wherein a distance between the control electrode and the further control electrode is greater than a size of the control electrode and/or the further control electrode.

6. The optical sensor device of claim 1, further comprising:
   a transfer gate configured to provide the photo-generated charge carriers to the read-out node in a read-out mode of the optical sensor device and to separate the photo-generated charge carriers from the read-out node in a sensing mode of the optical sensor device.

7. The optical sensor device of claim 1, further comprising:
   a buried channel in the semiconductor substrate between the conversion region and the read-out node to obtain an increased read-out efficiency of the optical sensor device.

8. The optical sensor device of claim 1, wherein the control electrode and the isolating material are formed in a trench of the semiconductor substrate.

9. The optical sensor device of claim 8, wherein a further control electrode is formed in a further trench of the semiconductor substrate, wherein an isolating material separates the control electrode from the semiconductor substrate bounding the trench and wherein the conversion region is formed between the control electrode and the further control electrode.

10. The optical sensor device of claim 9, further comprising:
    an embedded isolating material, wherein the embedded isolating material is embedded in the semiconductor substrate, wherein the embedded isolating material extends from the trench to the further trench and wherein the embedded isolating material and a main surface region of the semiconductor substrate form a boundary of the conversion region.

11. The optical sensor device of claim 1, further comprising:
a controller, wherein the controller is configured to control an alternating potential applied to the control electrode such that an electric potential distribution is generated in the conversion region to perform a phase-sensitive demodulation of the photo-generated charge carriers in the conversion region.

12. The optical sensor device of claim 11, wherein the controller is configured to provide the control electrode and a further control electrode with anticyclical alternating electric potentials such that an alternating current is provided into the semiconductor substrate between the doping region and a further doping region, wherein the alternating current generates the electric potential distribution in the conversion region.

13. A method for manufacturing an optical sensor device, the method comprising:
providing a semiconductor substrate comprising a conversion region to convert an electromagnetic signal into photo-generated charge carriers;
providing a read-out node configured to read-out the photo-generated charge carriers;
separating a control electrode by an isolating material from the semiconductor substrate; and
forming a doping region in the semiconductor substrate between the control electrode and the conversion region, wherein the doping region comprises a doping concentration that is higher as compared to a minimum doping concentration of the conversion region, wherein the doping concentration is at least 1000 times higher than the minimum doping concentration of the conversion region, wherein the doping region extends into the semiconductor substrate;
wherein a projection of the control electrode towards the conversion region overlaps the doping region or is located in the doping region; and
wherein the optical sensor device is a time-of-flight sensor.

14. An optical time of flight sensor device, comprising:
a semiconductor substrate comprising a conversion region to convert an electromagnetic signal into photo-generated charge carriers;
a read-out node configured to read out photo-generated charge carriers, the read-out node comprising a first doping type;
a control electrode which is separated by an isolating material from the conversion region; and
a vertical extending doping region which is formed in the semiconductor substrate, wherein the vertical extending doping region comprises the first doping type, wherein at least a part of the vertical extending doping region provides a conversion of at least a portion of the electromagnetic signal into the photo-generated charge carriers, and
wherein a ratio of a vertical extension of the vertical extending doping region to a lateral extension of the conversion region is between 0.2 to 5.

15. The optical time of flight sensor device according to claim 14, further comprising:
a doping region, which is formed in the semiconductor substrate between the control electrode and the conversion region, wherein the doping region comprises a doping concentration that is higher as compared to the conversion region, wherein the doping concentration is at least 1000 times higher than a minimum doping concentration of the conversion region.

16. The optical time of flight sensor device according to claim 14, wherein a minimum doping concentration of the conversion region in the semiconductor substrate is within the vertical extending doping region.

17. The optical time of flight sensor device according to claim 14, wherein the vertical extending doping region contributes at least partially to a demodulation efficiency of the optical time of flight sensor device.

18. An optical time of flight sensor device, comprising:
a semiconductor substrate comprising a conversion region to convert an electromagnetic signal into photo-generated charge carriers;
a read-out node configured to read out the photo-generated charge carriers;
a control electrode which is separated by a first isolating material from the semiconductor substrate; and
a separation gate which is separated by a second isolating material from the semiconductor substrate;
wherein the control electrode and the first isolating material are formed in a trench of the semiconductor substrate, wherein an extension of the trench into the semiconductor substrate perpendicular to a main surface region is greater than a distance between the read-out node and the trench, and
wherein the separation gate is arranged between the read-out node and the trench.

19. An optical sensor device, comprising:
a semiconductor substrate comprising a conversion region to convert an electromagnetic signal into photo-generated charge carriers;
a read-out node configured to read out the photo-generated charge carriers;
a control electrode which is separated by an isolating material from the semiconductor substrate; and
a doping region in the semiconductor substrate between the control electrode and the conversion region, wherein the doping region comprises a doping concentration that is higher as compared to a minimum doping concentration of the semiconductor substrate in a region extending from the doping region into the semiconductor substrate by a distance of a maximum extension of the control electrode, wherein the maximum extension extends perpendicular to a direction of projection of the control electrode towards the conversion region, wherein the doping concentration is at least 1000 times higher than the minimum doping concentration, wherein the doping region extends into the semiconductor substrate;
wherein the projection of the control electrode towards the conversion region overlaps the doping region or is located in the doping region; and
wherein the optical sensor device is a time-of-flight sensor.

20. An optical time of flight sensor device, comprising:
a semiconductor substrate comprising a conversion region to convert an electromagnetic signal into photo-generated charge carriers;
a read-out node configured to read out photo-generated charge carriers, the read-out node comprising a first doping type;
a control electrode which is separated by an isolating material from the conversion region;
a vertical extending doping region which is formed in the semiconductor substrate, wherein the vertical extending doping region comprises the first doping type, wherein at least a part of the vertical extending doping region provides a conversion of at least a portion of the electromagnetic signal into the photo-generated charge carriers; and a doping region, which is formed in the semiconductor substrate between the control electrode and the conversion region, wherein the doping region comprises a doping concentration that is higher as compared to the conversion region, wherein the doping concentration is at least 1000 times higher than a minimum doping concentration of the conversion region.

21. An optical time of flight sensor device, comprising:
a semiconductor substrate comprising a conversion region to convert an electromagnetic signal into photo-generated charge carriers;
a read-out node configured to read out photo-generated charge carriers, the read-out node comprising a first doping type;
a control electrode which is separated by an isolating material from the conversion region; and
a vertical extending doping region which is formed in the semiconductor substrate, wherein the vertical extending doping region comprises the first doping type, wherein at least a part of the vertical extending doping region provides a conversion of at least a portion of the electromagnetic signal into the photo-generated charge carriers,
wherein a minimum doping concentration of the conversion region in the semiconductor substrate is within the vertical extending doping region.

22. An optical time of flight sensor device, comprising:
a semiconductor substrate comprising a conversion region to convert an electromagnetic signal into photo-generated charge carriers;
a read-out node configured to read out photo-generated charge carriers, the read-out node comprising a first doping type;
a control electrode which is separated by an isolating material from the conversion region; and
a vertical extending doping region which is formed in the semiconductor substrate, wherein the vertical extending doping region comprises the first doping type, wherein at least a part of the vertical extending doping region provides a conversion of at least a portion of the electromagnetic signal into the photo-generated charge carriers,
wherein the vertical extending doping region contributes at least partially to a demodulation efficiency of the optical time of flight sensor device.

* * * * *